(12) United States Patent
Aoki

(10) Patent No.: US 8,110,985 B2
(45) Date of Patent: Feb. 7, 2012

(54) LIGHT-EMITTING DEVICE HAVING PROTECTIVE CIRCUITS

(75) Inventor: Koji Aoki, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/823,373

(22) Filed: Jun. 25, 2010

(65) Prior Publication Data

US 2010/0264822 A1   Oct. 21, 2010

Related U.S. Application Data

(63) Continuation of application No. 11/167,754, filed on Jun. 28, 2005, now Pat. No. 7,772,766.

(30) Foreign Application Priority Data

Jul. 26, 2004 (JP) ................................. 2004-216892
Apr. 6, 2005 (JP) ................................. 2005-109440

(51) Int. Cl.
*H01J 1/62* (2006.01)

(52) U.S. Cl. ........................................ 313/506; 313/505

(58) Field of Classification Search ........... 313/498–512
See application file for complete search history.

(56) References Cited

U.S. PATENT DOCUMENTS

| | | | |
|---|---|---|---|
| 5,504,348 A | 4/1996 | Yoshida et al. |
| 5,909,035 A | 6/1999 | Kim |
| 5,936,687 A | 8/1999 | Lee |
| 6,166,713 A | 12/2000 | Asai et al. |
| 6,225,750 B1 | 5/2001 | Kimura |
| 6,333,661 B1 | 12/2001 | Ando et al. |
| 6,388,389 B2 | 5/2002 | Kimura |
| 6,469,450 B2 | 10/2002 | Kimura |
| 6,642,665 B2 | 11/2003 | Kimura |
| 7,034,787 B2 | 4/2006 | Date et al. |
| 7,180,515 B2 | 2/2007 | Miyagawa et al. |
| 7,453,453 B2 | 11/2008 | Miyagawa et al. |
| 2001/0020705 A1* | 9/2001 | Miyata ........................... 257/173 |
| 2003/0094612 A1 | 5/2003 | Yamazaki et al. |
| 2003/0203523 A1 | 10/2003 | Yamazaki et al. |
| 2005/0168490 A1 | 8/2005 | Takahara |
| 2005/0168491 A1 | 8/2005 | Takahara et al. |
| 2005/0180083 A1 | 8/2005 | Takahara et al. |
| 2005/0259494 A1 | 11/2005 | Kimura et al. |
| 2006/0022206 A1 | 2/2006 | Hayakawa et al. |

(Continued)

FOREIGN PATENT DOCUMENTS

JP        A-07-333654        12/1995

(Continued)

*Primary Examiner* — Bumsuk Won
(74) *Attorney, Agent, or Firm* — Oliff & Berridge, PLC

(57) ABSTRACT

A light-emitting device includes a plurality of unit circuits that are arranged in an element forming region on a substrate, each unit circuit having a light-emitting element that has a first electrode and a second electrode, and a transistor that controls a current flowing in the light-emitting element, a plurality of power lines that are wired in a peripheral region disposed in a periphery of the element forming region so as to supply power having different potentials, a current supply line that is wired to extend from the peripheral region to the element forming region and that is electrically connected to the first electrode via the transistor in each of the unit circuits, and a current supply line protective circuit that is provided in the peripheral region and that has protective elements connected between the current supply line and the plurality of power lines.

4 Claims, 16 Drawing Sheets

U.S. PATENT DOCUMENTS

| | | |
|---|---|---|
| 2006/0176252 A1 | 8/2006 | Date et al. |
| 2009/0122049 A1 | 5/2009 | Miyagawa et al. |

FOREIGN PATENT DOCUMENTS

| | | |
|---|---|---|
| JP | A-09-080469 | 3/1997 |
| JP | A-10-039325 | 2/1998 |
| JP | A-10-294383 | 11/1998 |
| JP | A-11-072806 | 3/1999 |
| JP | A-11-183876 | 7/1999 |
| JP | A-2000-089685 | 3/2000 |
| JP | A-2000-098338 | 4/2000 |
| JP | A-2000-284727 | 10/2000 |
| JP | A-2000-199918 | 12/2000 |
| JP | A-2003-283267 | 10/2003 |
| JP | A-2003-308050 | 10/2003 |
| JP | A-2003-323154 | 11/2003 |
| JP | A-2004-029755 | 1/2004 |
| JP | A-2004-069993 | 3/2004 |
| JP | 2004-117921 | 4/2004 |
| JP | A-2004-117921 | 4/2004 |
| JP | A-2004-170943 | 6/2004 |
| JP | A-2006-011386 | 1/2006 |
| JP | A-2006-011388 | 1/2006 |
| JP | A-2001-021918 | 1/2008 |
| KR | 1999-26578 | 4/1999 |

* cited by examiner

LIGHT-EMITTING DEVICE HAVING PROTECTIVE CIRCUITS

This application is a continuation of U.S. patent application Ser. No. 11/167,754, filed on Jun. 28, 2005, which claims priority to Japanese Application No. 2004-216892 filed on Jul. 26, 2004 and Japanese Application No. 2005-109440 filed on Apr. 6, 2005. The entire disclosures of the prior applications are hereby incorporated herein by reference in their entirety.

BACKGROUND

The present invention relates to a light-emitting device and to an electronic apparatus having the light-emitting device. More particularly, the present invention relates to a protective circuit of a light-emitting device.

A light-emitting device has a plurality of scanning lines, a plurality of data lines, light-emitting elements provided at intersections of the plurality of scanning lines and the plurality of data lines, a current supply line that supplies current to the light-emitting elements, and driving transistors that are provided on current paths from the current supply line to the light-emitting elements so as to control the current to the light-emitting elements. A plurality of unit circuits, each having at least the light-emitting element and a driving transistor, are arranged in a line or in a matrix shape. The light-emitting elements emit light according to selection signals from the scanning lines and data signals from the data lines.

In such a light-emitting device, a part or an entity of a scanning line driving circuit that supplies the selection signals to the scanning lines or a data line driving circuit that supplies the data signals to the data lines is incorporated into a substrate, where the light-emitting elements are provided, so as to serve as an internal circuit, or is attached to the substrate so as to serve as an external IC circuit. The scanning line driving circuit or the data line driving circuit may be deteriorated or destroyed for various reasons. In particular, a problem is caused by stress due to electrostatic discharge, that is, electrostatic destruction, which occurs while the light-emitting device is being manufactured or transported.

At least one of the scanning line driving circuit and the data line driving circuit may be incorporated into the substrate and a circuit, such as a driving power supply circuit which supplies power to them, a timing control circuit, or the like, may be constructed as an external IC circuit. Further, at least one of the scanning line driving circuit and the data line driving circuit of the substrate may be connected to the external IC circuit. In this case, in a manufacturing process of connecting the substrate to the external IC circuit, electrostatic charge flows in at least one of the scanning line driving circuit and the data line driving circuit formed on the substrate, which causes the circuit to be destroyed. Further, connecting terminals that connect at least one of the scanning line driving circuit and the data line driving circuit of the substrate to the external IC circuit may be provided on the substrate. In this case, electrostatic charge may flow in the light-emitting device through the connecting terminals. If the electrostatic charge is applied to wiring lines which are connected to the driving circuit, the driving circuit may be deteriorated or destroyed.

In order to prevent such deterioration or destruction of the driving circuit due to electrostatic charge, a protective circuit is provided on a signal path through which a signal is input/output in the driving circuit (see Japanese Unexamined Patent Application Publication Nos. 10-294383 and 2003-308050). More specifically, the protective circuit may be provided as an input protective circuit for an input terminal, to which various signals including clock signals, inversion clock signals, start pulses, and the like are input from the outside of the driving circuit. Alternatively, the protective circuit may be provided as an output protective circuit for an output terminal, through which various signals including scanning signals, end pulses, and the like are output to the outside of the driving circuit.

Further, a technique in which, in an insulated-gate-type transistor circuit, electrostatic charge accumulated in a floating portion of the circuit is effectively discharged so as to prevent destruction of an element due to the electrostatic charge has been suggested (for example, see Japanese Unexamined Patent Application Publication No. 2000-98338).

Further, in addition to the above-described techniques, various techniques for protecting various display devices from electrostatic charge has been suggested (for example, see Japanese Unexamined Patent Application Publication Nos. 9-80469, 10-39325, 11-72806, and 2000-89685).

As described above, the light-emitting device has, for example, the plurality of scanning lines, the plurality of data lines, the light-emitting elements provided at the intersections of the plurality of scanning lines and the plurality of data lines, the current supply line that supplies the current to the light-emitting elements, and the driving transistors that are provided on the current paths from the current supply line to the light-emitting elements so as to control the current to the light-emitting elements. In particular, the current supply line is thicker than other wiring lines and is connected to the current supply source and the light emitting elements with low resistance so as to supply the current to the light-emitting elements. Further, when the unit circuits are formed in a line or in a matrix shape, each unit circuit having at least the light-emitting element and the driving transistor, the current supply line needs to have low resistance so that the plurality of unit circuits uniformly emit.

However, if the current supply line is made to have low resistance in such a manner, the electrostatic charge reaches the unit circuits via the current supply line, which results in the unit circuits being deteriorated or destroyed due to electrostatic destruction. In particular, when each unit circuit includes an element having two conductive layers with a dielectric film interposed therebetween, insulation breakdown may occur in the dielectric film, such that the unit circuit may be deteriorated or destroyed. As the element having two conductive layers with the dielectric film interposed therebetween, for example, a MOS field effect transistor or a capacitive element is exemplified.

Further, a unit circuit in which the current flows from the current supply line to the data line, a predetermined potential is written into a gate of the driving transistor, and a current according to the voltage flows in the light-emitting element has been suggested. Such a method is referred to as a current programming method. In addition, the current programming method is broadly divided into a method in which the predetermined potential is written into the gate of the driving transistor by allowing the current to flow via the driving transistor of the unit circuit, and a method in which the predetermined potential is written into the gate of the driving transistor by allowing the current to flow via a mirror transistor which constitutes a mirror circuit together with the driving transistor. In such a current programming method, it is necessary to make the current supply line have low resistance and also to make the data line have low resistance such that the predetermined potential is accurately written into the data line. In this case, however, the electrostatic charge may reach the unit circuit via the data line.

In particular, there is a case in which a current supply circuit that supplies current to the current supply line or the data line driving circuit is constituted by an external IC circuit and the light-emitting elements of the substrate are connected to the external IC circuit. In this case, however, the electrostatic charge may reach the unit circuits from the connecting terminals that connect the light-emitting elements of the substrate to the external IC circuit.

As described above, various transistors included in the unit circuits may be destroyed due to an unexpected voltage caused by the electrostatic charge from the current supply line and the data lines. Accordingly, the yield in a manufacturing process of the light-emitting device may be decreased. In particular, organic electroluminescent (EL) elements are current-driven-type light-emitting elements, and thus it is important to suppress the unexpected voltage caused by the electrostatic charge from the current supply line or the data lines from being applied to the unit circuits, while ensuring a path through which a driving current or a data signal is supplied to the unit circuit.

As such, in the light-emitting device, the yield of the light-emitting device in the manufacturing process may be enhanced by reducing electrostatic destruction of the element included in the unit circuit due to the electrostatic charge. In this case, however, the current path, through which the driving current or the data signal is supplied to the unit circuit, for a high-quality image display cannot be ensured, while simultaneously enhancing the yield. In the Japanese Unexamined Patent Application Publications described above, as for the current-driven-type light-emitting device, there is no description about the two points described above.

SUMMARY

An advantage of the invention is that it provides a light-emitting device having a protective circuit that protects the device from electrostatic destruction.

According to a first aspect of the invention, a light-emitting device includes a plurality of unit circuits that are arranged in an element forming region on a substrate, each unit circuit having a light-emitting element that has a first electrode and a second electrode, and a transistor that controls a current flowing in the light-emitting element, a plurality of power lines that are wired in a peripheral region disposed in a periphery of the element forming region so as to supply power having different potentials, a current supply line that is wired to extend from the peripheral region to the element forming region and that is electrically connected to the first electrode via the transistor in each of the unit circuits, and a current supply line protective circuit that is provided in the peripheral region and that has protective elements connected between the current supply line and the plurality of power lines.

In accordance with the first aspect of the invention, for example, the current supply line protective circuit is provided on the current supply line so as to discharge electrostatic charge from the current supply line and connecting terminals thereof while the light-emitting device is being manufactured, transported, or operated. Thus, it is possible to discharge the electrostatic charge from the current supply line and the connecting terminals to the plurality of power lines by the current supply line protective circuit. Therefore, an unexpected voltage caused by the electrostatic charge from the current supply line and the connecting terminals can be suppressed from being applied to the unit circuits. In addition, the current supply line in the element forming region limits light-emitting regions of the light-emitting elements in the unit circuits, that is, aperture ratios, and the plurality of power lines formed in the peripheral region have low resistance as compared to the current supply line. As a result, it is possible to discharge the electrostatic charge from the current supply line and the connecting terminals to the plurality of power lines.

Further, according to a second aspect of the invention, a light-emitting device includes a plurality of unit circuits that are arranged in an element forming region on a substrate, each unit circuit having a light-emitting element that has a first electrode and a second electrode, and a transistor that controls a current flowing in the light-emitting element, a plurality of power lines that are wired in a peripheral region disposed in a periphery of the element forming region so as to supply power having different potentials, a current supply line that is wired to extend from the peripheral region to the element forming region and that is electrically connected to the first electrode via the transistor in each of the unit circuits, a plurality of data lines that are wired to extend from the peripheral region to the element forming region so as to supply data signals to the unit circuits, and a data-line protective circuit that is provided in the peripheral region and that has protective elements connected between the data lines and the plurality of power lines.

In accordance with the second aspect of the invention, for example, the data-line protective circuit is provided on the data lines so as to discharge electrostatic charge from the data lines and connecting terminals thereof while the light-emitting device is being manufactured, transported, or operated. Thus, it is possible to discharge the electrostatic charge from the data lines and the connecting terminals to the plurality of power lines by the data-line protective circuit. Therefore, an unexpected voltage caused by the electrostatic charge from the data lines and the connecting terminals can be suppressed from being applied to the unit circuits. In addition, the data lines in the element forming region limit light-emitting regions of the light-emitting elements in the unit circuits, that is, aperture ratios, and the plurality of power lines formed in the peripheral region have low resistance as compared to the data lines. As a result, it is possible to discharge the electrostatic charge from the data lines and the connecting terminals to the plurality of power lines.

In particular, the second aspect of the invention is preferably applied to a light-emitting device of a current programming method in which the current flows from the current supply line to the data lines, a predetermined potential is written into a gate of the driving transistor, and a current according to the voltage flows in the light-emitting elements. In the light-emitting device of the current programming method, the unit circuits are connected to the data lines with low resistance, and thus the electrostatic charge may occur from connected portions between the data line driving circuit that supplies the data signals and the data lines. However, in accordance with the second aspect of the invention, the data-line protective circuit is provided, and thus the electrostatic charge can be prevented from reaching the unit circuits.

Further, it is preferable that the light-emitting device further includes scanning lines that are wired to extend from the peripheral region to the element forming region so as to supply scanning signals to the unit circuits. In the peripheral region, a scanning-line protective circuit having protective elements which are connected between the scanning lines and the plurality of power lines is provided.

In this case, it is possible to discharge the electrostatic charge from the scanning lines and connecting terminals thereof to the plurality of power lines by the scanning-line protective circuit. In addition, the scanning-line protective circuit is provided in the peripheral region of the element forming region, an excessive current can be prevented from flowing into the element forming region. Therefore, an excessive current can also be suppressed from flowing into the element forming region via the scanning lines, as well as the current supply line and the data lines. As a result, as compared to the case in which the current supply line protective circuit and the data-line protective circuit are provided on the current supply line and the data lines, respectively, the unit circuits can be protected more reliably.

It is preferable that the protective circuit, such as the current supply line protective circuit, the data-line protective circuit, the scanning-line protective circuit, or the like includes the protective elements provided between the plurality of power lines and the current supply line or the data lines. The protective element may include a diode. By using the power line which is used when the light-emitting device emits light and in consideration of the potential on the power line and the potential on the current supply line or the data line, which are applied for the emission, a power line for supplying a low potential and a power line for supplying a high potential are connected to two terminals of the diode, respectively. If doing so, as compared to the case in which a protective resistor is provided on the current supply line or the data line, there is no case in which electrical resistance of the current supply line or the data line is increased. That is, the current supply line protective circuit and the data-line protective circuit do not obstruct the driving current to the unit circuits. Thus, when the light-emitting device is operated, a required driving current can be supplied to the respective unit circuits of the light-emitting device. As such, even when the current supply line protective circuit is provided along the current supply line or even when the data-line protective circuit is provided along the data lines, the current supply line protective circuit or the data-line protective circuit do not serve as a resistive element with respect to the driving current. As a result, the driving current required for the emission of the light-emitting element can be supplied from the current supply line or the data lines. Therefore, there is no case in which the emission of the light-emitting device is degraded.

As described above, in accordance with the first or second aspect of the invention, the unexpected voltage caused by the electrostatic charge from the current supply line or the data lines and the connecting terminals thereof can be suppressed from being applied to the element forming region, without degrading the image quality of the current-driven-type light-emitting element. Therefore, as for the light-emitting device, a yield in a manufacturing process can be suppressed from being degraded and a high quality emission can be achieved.

Here, 'the plurality of power lines' according to the first or second aspect of the invention are wiring lines that supply the power to various elements to drive the light-emitting elements and are typically provided in the light-emitting device. Various elements to drive the light-emitting elements represent the respective elements included in the scanning line driving circuit, the data line driving circuit, the unit circuit, or the like. Therefore, the current paths for discharging the electrostatic charge can be ensured, without significantly changing a specification of wiring of the light-emitting device. In addition, for example, when the plurality of power lines are provided so as to surround the element forming region, the electrostatic charge can be discharged from the current supply line and the data lines which extend from the respective unit circuits. Therefore, the unexpected voltage can be suppressed from being applied to the respective unit circuits and the entire element forming region can be protected from electrostatic destruction. Further, the plurality of power lines are preferably provided so as to surround the element forming region. Alternatively, the current supply line may be wired to extend from the peripheral region to the element forming region, the power may be connected to the current supply line in a region excluding the element forming region, and at least the current supply line protective circuit may be provided between the current supply line and the power in the peripheral region of the element forming region. Here, the region excluding the element forming region represents a region in a periphery of the element forming region or the external IC circuit. Similarly, at least the data-line protective circuit or the scanning-line protective circuit may be provided between the data lines formed in the element forming region and the data line driving circuit or between the scanning lines formed in the element forming region and the scanning line driving circuit, respectively.

Further, it is preferable that the light-emitting device further includes a scanning line driving circuit that supplies the scanning signals to the unit circuits via the scanning lines or a data line driving circuit that supplies the data signals to the unit circuits via the data lines, in the peripheral region. The scanning line driving circuit or the data line driving circuit may include complementary transistors. The plurality of power lines may be a plurality of power lines that supply the power to the scanning line driving circuit or the data line driving circuit.

In this case, the scanning line driving circuit or the data line driving circuit is provided in the peripheral region and the plurality of power lines are used to supply the power to the scanning line driving circuit or the data line driving circuit. Thus, a plurality of power lines need to be additionally wired. In particular, the scanning line driving circuit or the data line driving circuit is connected to the scanning lines or the data lines formed in the element forming region and is provided close to the element forming region. Therefore, the plurality of power lines that supply the power to the scanning line driving circuit or the data line driving circuit is easily connected to the protective circuit. Further, between the scanning line driving circuit or the data line driving circuit and the plurality of power lines, a protective circuit may be further provided.

Further, it is preferable that, in the peripheral region, resistive elements are provided between the data lines and the data line driving circuit or between the scanning lines and the scanning line driving circuit.

In this case, the resistive elements can suppress the excessive current from flowing into the unit circuits via the data lines and the scanning lines. As a result, it is possible to protect the unit circuits from electrostatic destruction.

It is preferable that the data-line protective circuit includes a plurality of diodes that are connected in series to one another. The plurality of diodes may be arranged across intersections between the current supply line and the data lines.

The electrostatic charge is easily accumulated at the intersections between the current supply line and the data lines. However, in accordance with the above-described configuration, the plurality of diodes serving as the data-line protective circuit are arranged across the intersections between the current supply line and the data lines, and thus the electrostatic charge accumulated at the intersections can be discharged preferentially to the power lines. Therefore, an excessive current caused by the electrostatic charge accumulated at the intersections between the current supply line and the data lines can be suppressed from flowing into the unit circuits.

It is preferable that the scanning-line protective circuit includes a plurality of diodes that are connected in series to one another. The plurality of diodes may be arranged across intersections between one of the plurality of power lines and the scanning lines.

The electrostatic charge is easily accumulated at the intersections between one of the plurality of power lines and the scanning lines. However, in accordance with the above-described configuration, the plurality of diodes serving as the scanning-line protective circuit are arranged across the intersections between one of the plurality of power lines and the scanning lines, and thus the electrostatic charge accumulated at the intersections can be discharged preferentially to the power lines. Therefore, for example, an excessive current caused by the electrostatic charge accumulated at the intersections between one of the plurality of power lines and the scanning lines can be suppressed from flowing into dummy unit circuits or the unit circuits.

It is preferable that the light-emitting device further includes second electrode wiring lines, each being electrically connected to the second electrode of the light-emitting element and current paths through which the electrostatic charge from at least one of the current supply line and the data lines is discharged to the second electrode wiring lines.

In this case, the electrostatic charge from at least one of the current supply line and the data lines can be discharged to the second electrode wiring lines, each being electrically connected to the second electrode of the light-emitting element. The second electrode wiring lines are wiring lines which are provided to drive the light-emitting elements. As a result, the electrostatic charge can be discharged without providing additional wiring lines to discharge the electrostatic charge.

It is preferable that, in the peripheral region, the current supply line includes a main line that extends to surround the element forming region and a plurality of branch lines that extend from the main line into the element forming region. The plurality of branch lines may be electrically connected to one another in the element forming region.

In this case, for example, the plurality of unit circuits in the element forming region may be arranged in a line or in a matrix shape and the light-emitting elements included in the respective unit circuits may be drive by an active control. Further, in this case, the main line of the current supply line extends to surround the element forming region in the peripheral region of the element forming region and the plurality of branch lines are provided so as to be electrically connected to one another in the element forming region. Therefore, the electrostatic charge from any one of the branch lines in the element forming region can be discharged through the branch lines, which are electrically connected to one another in the element forming region, and the main line. Accordingly, the entire element forming region can be protected from the electrostatic destruction.

Further, according to a third aspect of the invention, there is provided a light-emitting device in which, on a substrate, an element forming region has a light-emitting region and a non-light-emitting region formed in a periphery of the light-emitting region. The light-emitting device includes a plurality of unit circuits that are arranged in the light-emitting region, each unit circuit having a light-emitting element that has a first electrode and a second electrode, and a first transistor that controls a current flowing in the light-emitting element, a plurality of dummy unit circuits that are arranged in the non-light-emitting region, each dummy unit circuit having a second transistor, and a current supply line that is wired to extend from a peripheral region to the element forming region and that is electrically connected to the first electrode via the first transistor in each of the unit circuits. The dummy unit circuits may be connected to the current supply line.

In accordance with the third aspect of the invention, the electrostatic charge can be prevented from reaching the unit circuits and from causing the unit circuits to be destroyed. Further, a leak current caused by the emission of each of the dummy unit circuits when the light-emitting device is emitted can be prevented from flowing.

Further, according to a fourth aspect of the invention, there is provided a light-emitting device in which, on a substrate, an element forming region has a light-emitting region and a non-light-emitting region formed in a periphery of the light-emitting region. The light-emitting device includes a plurality of unit circuits that are arranged in the light-emitting region, each unit circuit having a light-emitting element that has a first electrode and a second electrode, and a first transistor that controls a current flowing in the light-emitting element, a plurality of dummy unit circuits that are arranged in the non-light-emitting region, each dummy unit circuit having a second transistor, a plurality of power lines that are wired in a peripheral region disposed in a periphery of the element forming region so as to supply power having different potentials to the unit circuits, a current supply line that is wired to extend from the peripheral region to the element forming region and that is electrically connected to the first electrode via the first transistor in each of the unit circuits. The dummy unit circuits may be connected to any one of the plurality of power lines.

In accordance with the fourth aspect of the invention, the electrostatic charge can be prevented from reaching the unit circuits and from causing the unit circuits to be destroyed. Further, the leak current caused by the emission of each of the dummy unit circuits when the light-emitting device is emitted can be prevented from flowing.

It is preferable that the light-emitting device further includes a dummy-unit-circuit protective circuit that has protective elements provided between the dummy unit circuits and one of the plurality of power lines.

In this case, the electrostatic charge from the dummy unit circuits can be discharged to one of the plurality of power lines. Since the electrostatic charge from the unit circuits is discharged to the power lines through the dummy-unit-circuit protective circuit, the unit circuits can be suppressed from being destroyed due to the electrostatic charge. Moreover, since the dummy unit circuits are not driven, at the time of the operation of the light-emitting device, there is no difficulty in driving the unit circuits even when the electrostatic charge is discharged to a power line, which supplies a low-potential power, from the plurality of power lines.

Further, according to a fifth aspect of the invention, a light-emitting device includes a plurality of unit circuits that are arranged in an element forming region on a substrate, each unit circuit having a light-emitting element that has a first electrode and a second electrode, and a transistor that controls a current flowing in the light-emitting element, a first current supply line that is wired to extend from a peripheral region of the element forming region to the element forming region and that is electrically connected to the first electrode via the transistor, a second current supply line that is wired to extend from the peripheral region to the element forming region and that is electrically connected to the second electrode, data lines that are wired to extend from the peripheral region to the element forming region so as to supply data signals to the unit circuits, and a data-line protective circuit that is provided in the peripheral region and that has first protective elements connected between the data lines and the first current supply line, and second protective elements connected between the data lines and the second current supply line. The second electrode may be provided commonly to the plurality of unit circuits.

In accordance with the fifth aspect of the invention, with the data-line protective circuit provided on the data lines, the electrostatic charge from the data lines and connecting terminals thereof can be discharged to the first current supply line or the second supply line. Therefore, the electrostatic charge can be discharged more reliably and the electrostatic destruction of the unit circuits can be suppressed more effectively.

According to a sixth aspect of the invention, an electronic apparatus includes the above-described light-emitting device.

In accordance with the sixth aspect of the invention, since the electronic apparatus includes the above-described light-emitting device, the tolerance to the electrostatic charge can be enhanced. Thus, in manufacturing the electronic apparatus, the yield can be enhanced, and, after shipping, a device trouble can be prevented. Further, the required driving current can be supplied to the light-emitting elements and the sufficient emission of the light-emitting elements can be ensured. Thus, there is no case that the image quality is degraded. In addition, various electronic apparatuses, which have a high yield and little trouble and which can perform a high quality display, such as a cellular phone, an electronic organizer, a word processor, a view finder-type or monitor-direct-view-type video tape recorder, a workstation, a videophone, a POS terminal, a touch panel, and the like can be implemented.

DETAILED DESCRIPTION OF EMBODIMENTS

The effects and advantages of the invention will be apparent from embodiments described below.

Hereinafter, the embodiments of the invention will be described with reference to the drawings. Moreover, in the embodiments described below, a light-emitting device which uses an active-matrix-driving organic EL device will be described as an example of a light-emitting device according to the invention.

First Embodiment (Configuration of Organic EL Device)

Figure 1:
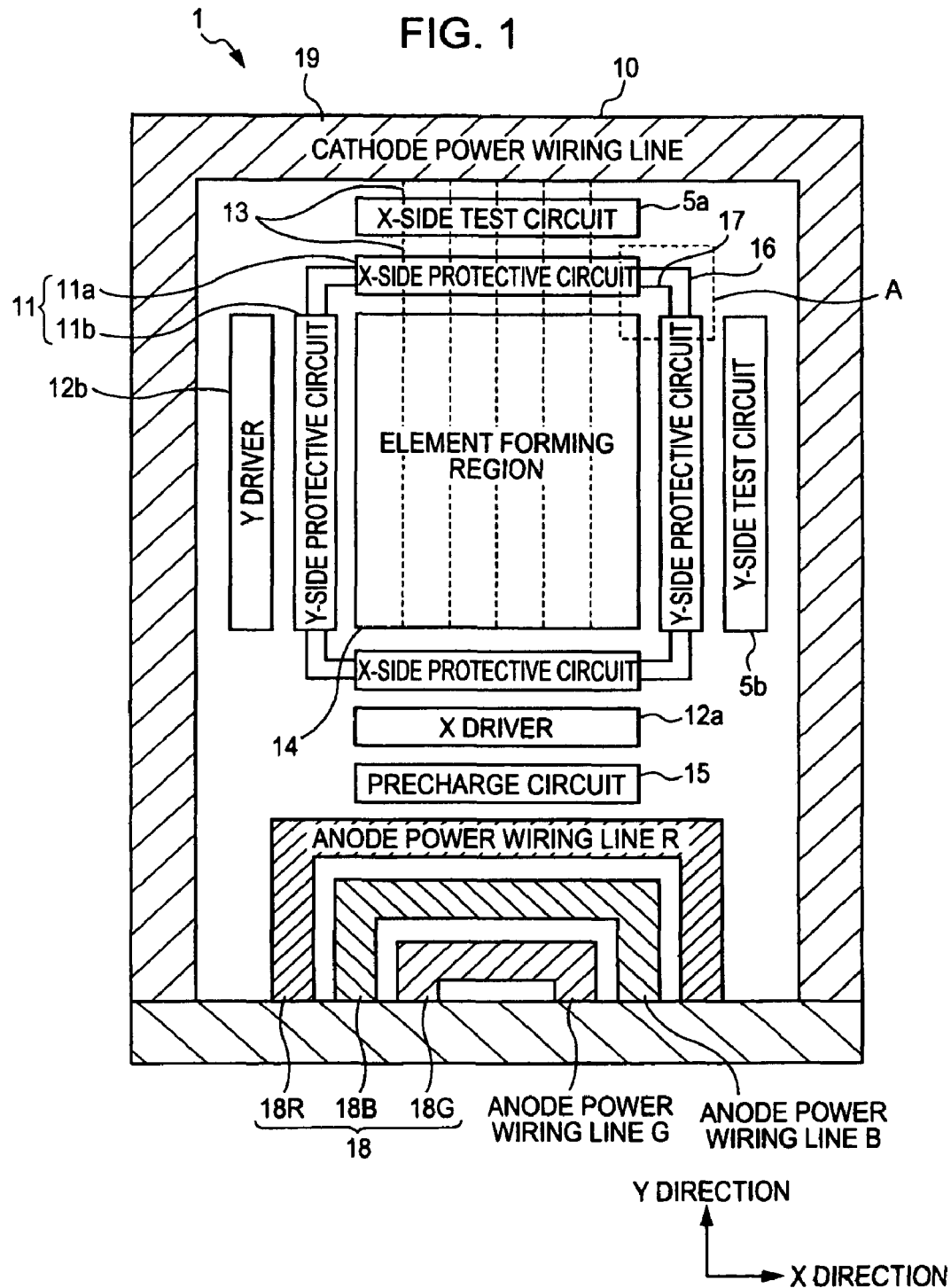
FIG. 1 is a diagram schematically showing an organic EL device according to a first embodiment of the invention.

FIG. 1 is a diagram schematically showing a configuration of an organic EL device 1 according to the present embodiment.

In FIG. 1, the organic EL device 1 has an organic EL panel 10, which is an example of 'an electro-optical panel' according to the invention, and a protective circuit 11 that protects the organic EL device 10. Moreover, in the present embodiment, in particular, the organic EL panel 10 has a built-in driving circuit. On an element substrate SUB, a data line driving circuit 12*a* (also referred to as an X driver) and a scanning line driving circuit 12*b* (also referred to as a Y driver) are provided. The protective circuit 11 is also provided on the element substrate SUB. Preferably, the data line driving circuit 12*a*, the scanning line driving circuit 12*b*, and the protective circuit 11 are incorporated into a peripheral region of the element substrate, together with semiconductor elements, such as transistors (hereinafter, referred to as TFTs) included in respective unit circuits, which are incorporated into an element forming region 14. Further, one of the driving circuits, such as the data line driving circuit 12*a* and the scanning line driving circuit 12*b*, is partially or entirely constructed as an external IC and is attached to the element substrate externally. In this case, driving circuit connecting terminals (not shown) that connect the external IC to the organic EL panel are provided.

The organic EL panel 10 has the scanning line driving circuit 12*b*, the data line driving circuit 12*a*, a precharge circuit 15, two logic power wiring lines 16 and 17 that extend to the periphery of the element forming region 14, a first power wiring line 18 including first power wiring lines 18R, 18G, and 18B, and a second power wiring line 19. In addition, the organic EL panel 10 has unit circuits 20 shown in FIG. 2, current supply lines L2, and data lines L1, which are examples of 'data lines' of the invention.

The first power wiring line 18 has the first power wiring lines 18R, 18G, and 18B electrically connected to first electrodes (anodes) of organic EL elements which emit respective color light components, respectively. One of the first power wiring lines 18R, 18G, and 18B corresponds to the current supply line L2 shown in FIG. 2 and supplies to the driving current to the organic EL element 29. The respective unit circuits 20 of the organic EL panel 10 have the organic EL elements, which are examples of light-emitting elements, which emit light components corresponding to wavelengths of red, green, and blue. The organic EL device 1 is a light-emitting device which can emit color light components. Moreover, in FIG. 2, for simplicity of explanation, one of the current supply lines L2 corresponding to the organic EL elements of the respective colors is shown.

The second power wiring line 19 is an example of 'a second electrode wiring line' according to the invention and is electrically connected to a second electrode of the organic EL element 29 of each of the unit circuits 20.

The protective circuit 11 is provided on the organic EL panel 10 to surround the element forming region 14 and has an X-side protective circuit 11*a* and a Y-side protective circuit 11*b*, which are provided across the element forming region 14 in pairs in the peripheral region disposed in the periphery of the rectangular element forming region 14. The X-side protective circuit 11*a* is disposed between the data line driving circuit 12*a* and the element forming region 14 and the Y-side protective circuit 11*b* extends between the scanning line driving circuit 12*b* and the element forming region 14. The X-side protective circuit 11*a* and the Y-side protective circuit 11*b* are electrically connected to the logic power wiring lines 16 and 17 which extend to surround the element forming region 14 in the peripheral region of the element forming region 14. The X-side protective circuit 11*a* and the Y-side protective circuit 11*b* prevent various elements included in the unit circuits 20 from being destroyed due to the electrostatic charge from the current supply line L2.

Figure 2:
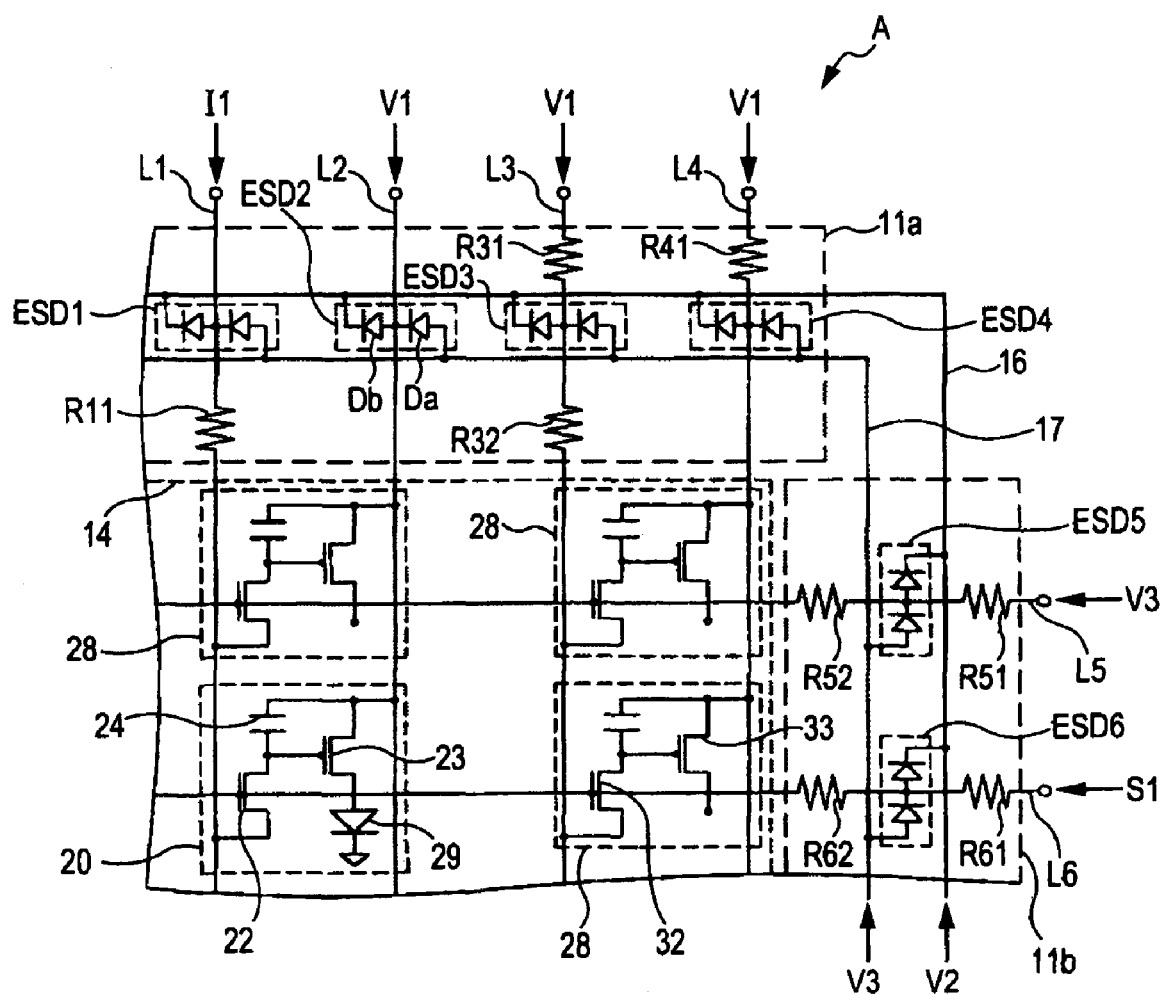
FIG. 2 is a diagram illustrating configurations of a protective circuit and a unit circuit of the organic EL device according to the first embodiment of the invention.

In FIGS. 1 and 2, the scanning line driving circuit 12*b* is a circuit which supplies a writing selection signal S1 as a scanning signal to a writing selection signal line L6. The writing selection signal S1 is a signal for switching a switching TFT 22 into an active state or an inactive state and is supplied to a gate of the switching TFT 22, which is described later.

The data line driving circuit 12*a* has a circuit that supplies a data signal I1 corresponding to an image signal to a sampling circuit, which samples the image signal transmitted from an image signal generating circuit 71 at a predetermined timing, and the data line L1. Further, the data line driving circuit 12*a* supplies the data signal I1 to the data line L1 according to the conduction state of the switching TFT 22.

The operation of the scanning line driving circuit 12*b* and the operation of the data line driving circuit 12*a* are synchronized with each other by synchronization signals, such as clock signals respectively supplied from a control circuit 72 or the like. Then, light is emitted according to an active matrix method.

Next, the details of the unit circuit 20 will be described with reference to FIG. 2. FIG. 2 is a plan view showing a part of four corners of the organic EL panel 10 shown in FIG. 1 in an enlarged scale. Further, FIG. 2 also shows the configurations of the protective circuit 11, the unit circuit 20, and a dummy unit circuit 28 in the organic EL panel 10.

In FIG. 2, in the element forming region 14, the unit circuits 20 and a plurality of dummy unit circuits 28 are provided. The unit circuits 20 are arranged in a matrix shape in the element forming region 14 and the dummy unit circuits 28 are provided in the periphery of the element forming region 14. Here, a region where the unit circuits 20 are formed is referred to as a light-emitting region and a region where the dummy unit circuits are formed is referred to as a non-light-emitting region. Moreover, in FIG. 2, only a region A which includes one unit circuit 20 provided in the part of the four corners of the organic EL panel 10 is shown.

In the present embodiment, the unit circuit 20 has the switching TFT 22, a driving TFT 23, a storage capacitor 24, and the organic EL element 29, which is an example of 'a light-emitting element' according to the invention.

A gate of the driving TFT 23 is electrically connected to one end of the storage capacitor 24 and also is electrically connected to a drain of the switching TFT 22. A source of the driving TFT 23 is connected to the current supply line L2 and a drain thereof is connected to the first electrode (anode) of the organic EL element 29. The gate of the switching TFT 22 is connected to the writing selection signal line L6 and a source thereof is connected to the data line L1.

The writing selection signal line L6, which is an example of 'the scanning line' according to the invention, supplies the writing selection signal S1 from the scanning line driving circuit 12*b* to the gate of the switching TFT 22 and switches the switching TFT 22 from the inactive state to the active state. Here, the active state means a state in which the source and the drain of the switching TFT 22 can be connected to each other. The switching TFT 22 switched into the active state allows the data signal I1 supplied from the data line L1 to flow between the source and the drain of the switching TFT, thereby allowing charge to be stored in the storage capacitor 24. With the charge stored in the storage capacitor 24, the data voltage is applied to the gate of the driving TFT 23, and thus the driving TFT 23 enters an operation state according to the data voltage applied to the gate thereof. The driving TFT 23 supplies the driving current according to the data potential from the current supply line L2 to the organic EL element 29, so that the organic EL element 29 emits light with a predetermined luminance. By synchronizing the data line driving circuit 12*a* and the scanning line driving circuit 12*b* and allowing the organic EL element 29 included in each of the unit circuits 20 to emit light, the organic EL device 1 can display the image.

The organic EL device of the invention may include the precharge circuit 15. The precharge circuit 15 charges or discharges the data line to prevent insufficient writing of the data signal and approximates the potential of the data line L1 to the potential of the data signal in advance. Therefore, an insufficient writing ability of the data signal to the data line L1 does not matter so much or does not matter at all in practice. Then, the data signal is written with a sufficient writing ability, and thus a high-quality image display can be performed.

The organic EL panel 10 may include an X-side test circuit 5*a* and a Y-side test circuit 5*b*. The X-side test circuit 5*a* and the Y-side test circuit 5*b* are used to test whether or not electrostatic charge is accumulated into the organic EL panel during the manufacturing process.

(Configuration of Protective Circuit)

Next the protective circuit 11 will be described in detail with reference to FIG. 2.

The logic power wiring lines 16 and 17, which are examples of 'a plurality of power lines' according to the invention, extend in the X and Y directions to surround the element forming region 14 in the peripheral region disposed in the periphery of the element forming region 14, respectively. The logic power wiring lines 16 and 17 are formed so as to surround the element forming region 14, but they may be formed along at least one side of the element forming region 14. Moreover, if they are formed so as to surround the element forming region 14, the electrostatic charge can be easily prevented from reaching the unit circuits.

Figure 11:
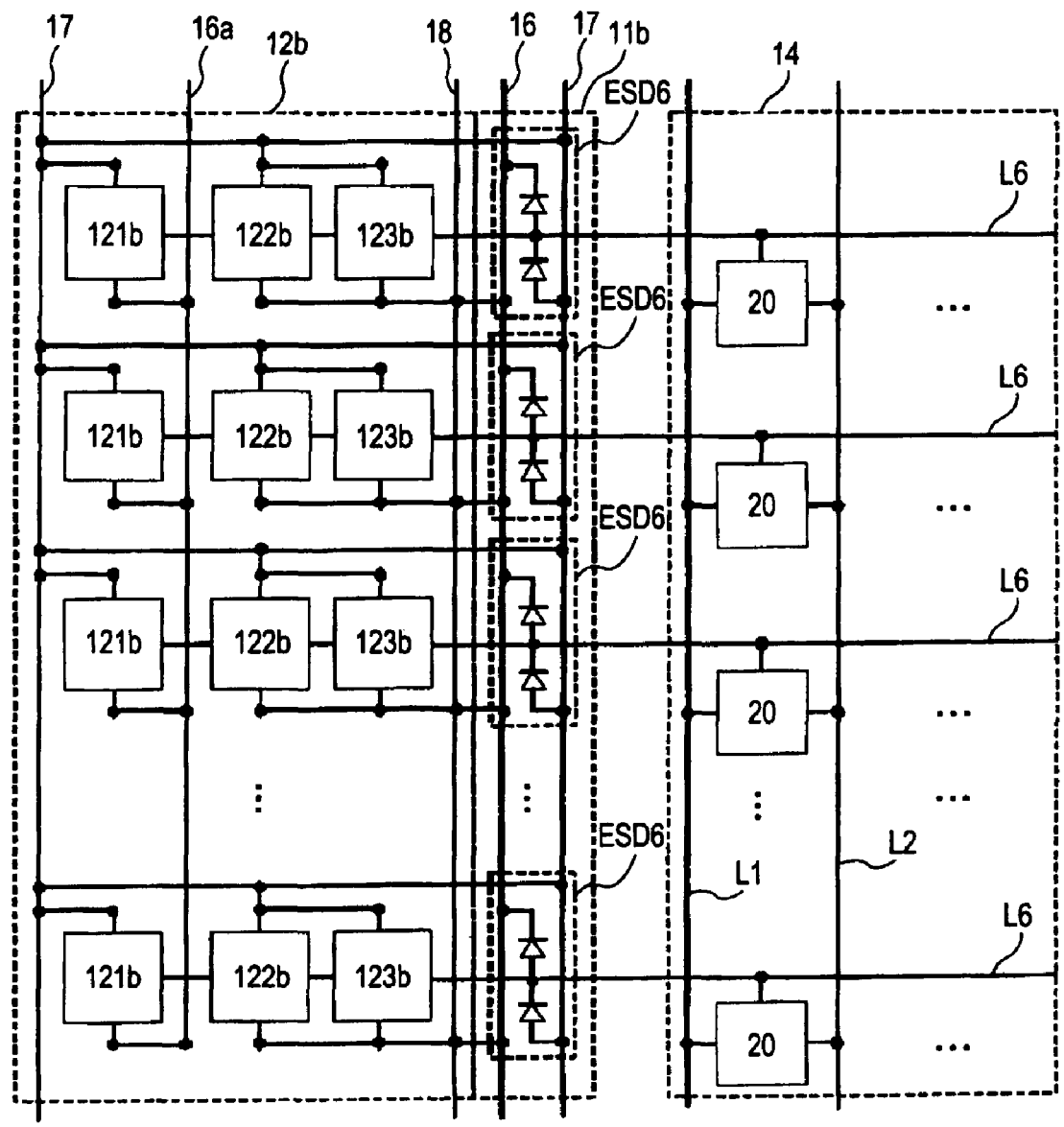
FIG. 11 is a diagram illustrating configurations of a protective circuit, a driving circuit, and a unit circuit of the organic EL device according to the first embodiment of the invention.

As shown in FIG. 11, the logic power wiring lines 16 and 17 supply the power to elements that drive the organic EL elements 29 included in the respective unit circuits 20, more specifically, elements that are included in the data line driving circuit 12*a* and the scanning line driving circuit 12*b* so as to supply various signals to the unit circuits 20. Here, the logic power wiring line 16 supplies a high-potential power V2 to the organic EL panel 10 and the logic power wiring line 17 supplies a low-potential power V3 to the organic EL panel 10. In addition, a logic power wiring line 16a supplies an intermediate-potential power V4, which is lower than the power V2 and is higher than the power V3, to the organic EL panel 10. FIG. 11 is a diagram showing the scanning line driving circuit 12b, the Y-side protective circuit 11b, and the element forming region 14. The scanning line driving circuit 12b has, for example, a shift transfer circuit 121b that transfers a shift pulse according to the clock signal, a level shift circuit 122b that sets an output from the shift transfer circuit to a predetermined voltage, and a buffer circuit 123b. An element used therein includes a switching element provided between the logic power wiring line 16 for supplying the high-potential power V2 and the logic power wiring line 17 for supplying the low-potential power V3, such as an inverter, a clocked inverter, or the like. The switching element is generally constituted by a complementary switching element. As shown in FIG. 11, the logic power wiring lines 16, 16a, and 17 are wired along the element forming region 14 in the scanning line driving circuit 12b and the power are supplied to the respective unit circuits 20 of the scanning line driving circuit 12b formed for the respective scanning lines L6. The intermediate-potential power V4 and the low-potential power V3 are supplied to the shift transfer circuit 121b by means of the logic power wiring lines 16a and 17. Further, the low-potential power V3 and the high-potential power V2 are supplied to the level shift circuit 122b and the buffer circuit 123b by means of the logic power wiring lines 17 and 16. Further, similarly, the high-potential power V2 and the low-potential power V3 are supplied to the Y-side protective circuit 11b by means of the logic power wiring lines 16 and 17. The high-potential power V2 and the low-potential power V3 are selected as the power which is connected to the Y-side protective circuit 11b. Among the power V2, V3, and V4, the highest potential power and the lowest potential power are selected to be connected to the Y-side protective circuit 11b. Further, the logic power wiring lines 16 and 17 are respectively wired in the scanning line driving circuit 12b and the Y-side protective circuit 11b, but, in view of layout, the wiring lines are preferably formed in common. In addition, in FIG. 11, only the scanning line driving circuit 12b and the Y-side protective circuit 11b are described, but the same can be applied to the data line driving circuit 12a and the X-side protective circuit 11a. The data line driving circuit 12a has, for example, a shift transfer circuit, a level shift circuit, a buffer circuit, and a sampling circuit. Similarly, the logic power wiring lines 16 and 17 are connected to the data line driving circuit 12a and the X-side protective circuit 11a.

The X-side protective circuit 11a has an electrostatic protective circuit ESD2 that is provided on the current supply line L2 and is electrically connected to the logic power wiring lines 16 and 17 and an electrostatic protective circuit ESD1 that is provided on the data line L1 and is electrically connected to the logic power wiring lines 16 and 17. The current supply line L2 is a wiring line that supplies the driving current to the organic EL element 29 included in the unit circuit 20 and is connected to the source of the driving TFT 23 included in the unit circuit 20. The data line L1 is a data line that supplies the data signal to the unit circuit 20 and is connected to the source of the switching TFT 22 included in the unit circuit 20.

The electrostatic protective circuit ESD2 provided on the current supply line L2, which is an example of 'a current supply line protective circuit' according to the invention, is electrically connected to the logic power wiring line 17 that supplies the low-potential power V3 and the logic power wiring line 16 that supplies the high-potential power V2. The electrostatic protective circuit ESD2 has, for example, two diodes Da and Db connected in series. An anode of the diode Da is connected to the logic power wiring line 17 that supplies the low-potential power V3 and a cathode of the diode Db is connected to the logic power wiring line 16 that supplies the high-potential power V2. A cathode of the diode Da and an anode of the diode Db are connected to the current supply line L2 which extends to the peripheral region of the element forming region 14.

When the high-potential electrostatic charge occurs in the current supply line L2 by the high-potential logic power wiring line 16, the electrostatic is discharged to the diode Db through the high-potential logic power wiring line 16. When the low-potential electrostatic charge occurs in the current supply line L2 by the low-potential logic power wiring line 17, the electrostatic charge is discharged to the low-potential logic power wiring line 17 through the diode Da. Therefore, the electrostatic protective circuit ESD2 can suppress an unexpected voltage caused by the electrostatic charge from the current supply line L2 from being applied to the driving TFT 23, thereby reducing the electrostatic destruction of the driving TFT 23.

The electrostatic protective circuit ESD2 is provided on a path through which the driving current is supplied from the current supply line L2 to the organic EL element 29. In this case, however, since the electrostatic protective circuit ESD2 does not function as an electrical resistance with respect to the driving current, there is no case in which the emission of the organic EL element 29 is disturbed. Further, there is no case in which the image quality of the organic EL device 1 is degraded.

The electrostatic protective circuit ESD1 provided on the data line L1 is an example of 'a data-line protective circuit' according to the invention. The electrostatic protective circuit ESD1 is connected to the two logic power wiring lines 16 and 17, like the electrostatic protective circuit ESD2. The electrostatic protective circuit ESD1 has two diodes connected in series, like the electrostatic protective circuit ESD2 provided on the current supply line L2, and discharges the electrostatic charge from the data line L1 to one of the logic power wiring lines 16 and 17 according to the potential of the electrostatic charge. That is, the electrostatic protective circuit ESD1 can discharge the electrostatic charge, which is difficult to be discharged through the electrostatic protective circuit ESD2 provided on the current supply line L2. Therefore, the electrostatic protective circuit ESD1 can suppress an unexpected voltage caused by the electrostatic charge from being applied to the switching TFT 22 connected to the data line L1, thereby reducing the electrostatic destruction of the switching TFT 22.

Moreover, in the present embodiment, a resistive element R11 is provided on the data line L1, such that the unit circuit 20 can be protected from the electrostatic charge more reliably.

As such, according to the electrostatic protective circuits ESD1 and ESD2, the unit circuit 20 can be protected from the electrostatic charge from the current supply line L2 and the data line L1, without interrupting the flows of various currents required for causing the organic EL element 29 to emit light. Further, the image quality of the organic EL panel 10 may be not degraded. Therefore, according to the electrostatic protective circuits ESD1 and ESD2, the electrostatic destruction of the unit circuit 20 can be reduced, without degrading the image quality of the organic EL device 1.

The Y-side protective circuit 11b is provided on the writing selection signal line L6, which is an example of 'the scanning line' according to the invention, and has an electrostatic protective circuit ESD6 that is electrically connected to the logic power wiring lines 16 and 17 and an electrostatic protective circuit ESD5 that is provided on a wiring line L5.

The electrostatic protective circuit ESD6, which is an example of 'a scanning-line protective circuit' according to the invention, has two diodes connected in series, like the above-described electrostatic protective circuits ESD1 and ESD2. The electrostatic protective circuit ESD6 discharges the electrostatic charge from the writing selection signal line L6 to one of the logic power wiring lines 16 and 17 according to the potential of the electrostatic charge. Therefore, the electrostatic protective circuit ESD6 reduces the electrostatic destruction of the switching TFT 22 due to the electrostatic charge from the writing selection signal line L6. Moreover, in the present embodiment, resistive elements R61 and R62 are provided on the writing selection signal line L6, and thus the unit circuit 20 can be protected from the electrostatic charge more reliably.

As such, according to the protective circuit 11 of the present embodiment, the unit circuit 20 can be protected from the electrostatic charge generated in the current supply line L2, the data line L1, and the writing selection signal line L6. Then, the elements, such as the switching TFT 22 and the driving TFT 23 included in the unit circuit 20, can be suppressed from being destroyed due to the electrostatic charge. Further, the electrostatic charge from the current supply line L2, the data line L1, and the writing selection signal line L6 is discharged to the logic power wiring lines 16 and 17 that are included in the data line driving circuit 12a and the scanning line driving circuit 12b so as to supply the power to various elements to be driven for driving the organic EL element 29. Thus, additional wiring lines to discharge the electrostatic charge do not need to be provided.

Therefore, according to the protective circuit 11 of the organic EL panel 10 of the present embodiment, the tolerance to the electrostatic charge of the organic EL panel 10 can be increased, without significantly changing the design. Further, in the manufacturing process, the yield of the organic EL panel 10 can be enhanced. In addition, since there is no case in which the image quality of the organic EL device 1 is degraded, the yield in the manufacturing process can be enhanced, without degrading the image quality. As a result, a high-quality organic EL device 1 can be provided.

(Configuration of Dummy Unit Circuit)

The dummy unit circuit 28 has the same elements as those included in the unit circuit 20, except that it does not have the organic EL element. The connection among these elements is the same as that in the unit circuit 20. A TFT 33 included in the dummy unit circuit 28 corresponds to the driving TFT 23 included in the unit circuit 20. A source of the TFT 33 is connected to a wiring line L4 connected to the power for supplying the driving current to the current supply line L2. A source of a TFT 32 included in the dummy unit circuit 28 is connected to a wiring line L3. Further, the dummy unit circuit 28 may include an organic EL element which is not connected thereto. The organic EL element formed in the dummy unit circuit 28 is provided so as to avoid a manufacturing failure in a peripheral portion of the element forming region, in manufacturing the organic EL element.

In addition, like the unit circuit 20, the dummy unit circuit 28 may be connected to the organic EL element. If doing so, the unit circuit 20 can be protected from the electrostatic charge.

In the protective circuit 11 of the peripheral region of the element forming region 14, electrostatic protective circuits ESD3 and ESD4 are provided on the wiring lines L3 and L4, respectively. The electrostatic protective circuits ESD3 and ESD4 are connected to the logic power wiring lines 16 and 17 to discharge the electrostatic charge from the wiring lines L3 and L4 to the logic power wiring line 16 or 17 and to suppress various elements included in the dummy unit circuit 28 and the unit circuit 20 from being destroyed due to the electrostatic charge. Moreover, in the present embodiment, resistive elements R31, R32, and R41 are provided on the wiring lines L3 and LA, respectively, such that the dummy unit circuit 28 can be protected from the electrostatic charge more reliably.

In the protective circuit 11 of the peripheral region of the element forming region 14, the electrostatic protective circuit ESD5, which is an example of 'a dummy-unit-circuit protective circuit' according to the invention, has the same configuration as that of the above-described electrostatic protective circuit ESD1 or ESD2 and is provided on the wiring line L5 in the peripheral region disposed in the periphery of the element forming region 14. The electrostatic protective circuit ESD5 receives the electrostatic charge from the dummy unit circuit 28 through the wiring line L5 and discharges the electrostatic charge to one of the logic power wiring lines 16 and 17. Therefore, the electrostatic protective circuit ESD5 can discharge the electrostatic charge from the dummy unit circuit 28 outside the element forming region 14, such that the dummy unit circuit 28 can be suppressed from being destroyed due to the electrostatic charge. Moreover, in the present embodiment, resistive elements R51 and R52 are provided on the wiring line L5, such that the dummy unit circuit 28 can be protected from the electrostatic charge more reliably.

The wiring line L5 supplies the low-potential power V3 to the dummy unit circuit 28. The wiring line L5 extends parallel to the writing selection signal line L6 in the dummy unit circuit 28. If doing so, the electrostatic charge can be prevented from reaching the unit circuit 20 and from causing the unit circuit 20 to be damaged. Further, when the organic EL device 1 emits light, the dummy unit circuit can be prevented from emitting light or the leak current can be prevented from flowing. Further, the same potential is supplied to the wiring lines L3 and LA. Here, the power V1 is connected to the wiring lines L3 and L4. In FIG. 2, the current supply line L2, the wiring line L3, and the wiring line L4 are supplied with the common power V1. Since the current supply line L2 and the wiring line L3 have the same potential, there is no power consumption through the transistor 33, the transistor 32, and the like. The electrostatic charge can be prevented from reaching the unit circuit 20 and from causing the unit circuit to be destroyed. Simultaneously, when the organic EL device 1 emits light, the dummy unit circuit can be prevented from emitting light or a leak current can be prevented from flowing.

Second Embodiment

Figure 12:
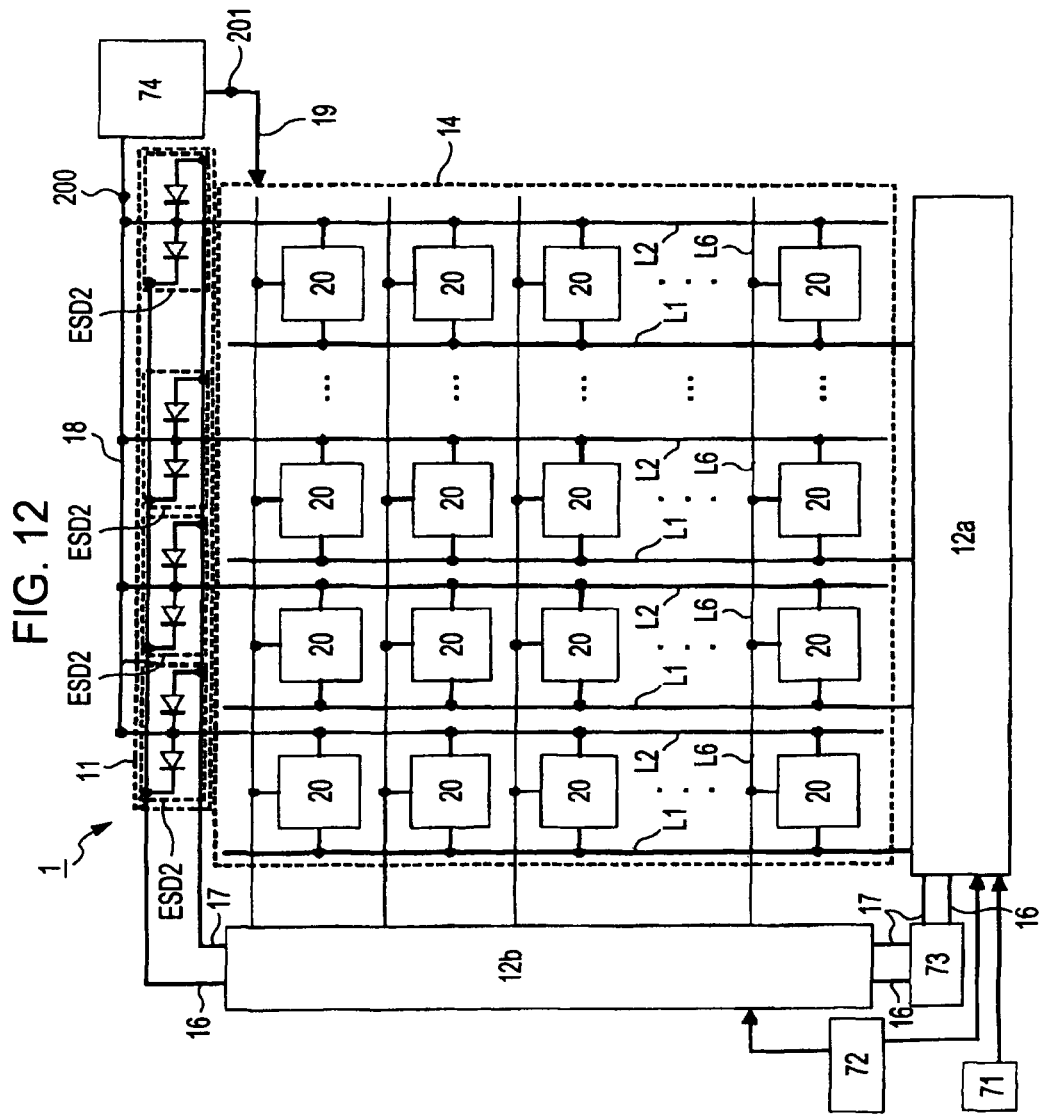
FIG. 12 is a diagram schematically showing a configuration of an organic EL device according to a second embodiment of the invention.

Next, another embodiment will be described. Moreover, respective aspects exemplarily described below may be properly combined with one another. Further, in the respective aspects described below, the same elements as those in the first embodiment are represented by the same reference numerals as those in FIGS. 1 and 2, and the descriptions thereof will be properly omitted. FIG. 12 is a diagram schematically showing a configuration of an organic EL device 1 according to a second embodiment.

In FIG. 12, the organic EL device 1 has a data line driving circuit 12a, a scanning line driving circuit 12b, a protective circuit 11, and an element forming region 14 in which unit circuits 20 are formed.

The scanning line driving circuit 12b is a circuit that supplies a writing selection signal S1 as an example of a scanning signal to a writing selection signal line L6. The writing selection signal S1 is a signal for switching a switching TFT 22 into an inactive state or an active state and is supplied to a gate of the switching TFT 22 which is described later.

The data line driving circuit 12a has a sampling circuit that samples an image signal transmitted from an image signal generating circuit 71 at a predetermined timing and a circuit that supplies a data signal I1 corresponding to the image signal to a data line L1. The data line driving circuit 12a supplies the data signal I1 to the data line L1 according to the conduction state of the switching TFT 22.

The operation of the scanning line driving circuit 12b and the operation of the data line driving circuit 12a are synchronized with each other by synchronization signals, such as clock signals respectively supplied from a control circuit 72 or the like. Then, light is emitted according to an active matrix method. Further, logic power wiring lines 16 and 17 supply power to the data line driving circuit 12a and the scanning line driving circuit 12b from a driving power supply circuit 73. Here, the logic power wiring line 16 supplies a high-potential power V2 and the logic power wiring line 17 supplies a low-potential power V3. Further, the logic power wiring lines 16 and 17 are connected to the protective circuit 11.

Like FIG. 2, the unit circuit 20 has the switching TFT 22, a driving TFT 23, a storage capacitor 24, and an organic EL element 29 which is an example of 'a light-emitting element' according to the invention. Further, the data line driving circuit 12a is connected to the respective unit circuits 20 via the data lines L1 and the scanning line driving circuit 12b is connected to the respective unit circuits 20 via the writing selection signal lines L6.

Here, the organic EL element 29 includes a first electrode, a second electrode, and a light-emitting layer interposed between the first electrode and the second electrode. The first electrode is provided to correspond to the unit circuit 20 and the second electrode is provided commonly to the plurality of unit circuits 20 which are provided in a matrix shape. The first electrode provided in the unit circuit 20 is connected to a light-emission power supply circuit 74 via the current supply line L2 and a first power wiring line 18 by means of a first power wiring line connecting terminal 200. The second electrode provided in the element forming region 14 is connected to the light-emission power supply circuit 74 via a second power wiring line 19 by means of a second power wiring line connecting terminal 201. The light-emission power supply circuit 74 supplies the power between the first power wiring line connecting terminal 200 and the second power wiring line connecting terminal 201. The first power wiring line 18 has first power wiring lines 18R, 18G, and 18B electrically connected to the first electrodes (anodes) of the organic EL elements which emit respective color light components. Here, for simplicity of explanation, like FIG. 2, one of the current supply lines L2 corresponding to the organic EL elements of the respective colors is shown.

The protective circuit 11 according to the second embodiment has an electrostatic protective circuit ESD2, which is an example of 'a current supply line protective circuit', in accordance with the current supply line L2. The electrostatic protective circuit ESD2 is provided between the first power wiring line 18 and the current supply line L2 formed in the element forming region 14.

As such, according to the electrostatic protective circuit ESD2, the unit circuit 20 can be protected from the electrostatic charge generated in the current supply line L2 or the first power wiring line connecting terminal. Further, the elements, such as the switching TFT 22 and the driving TFT 23 included in the unit circuit 20, can be suppressed from being destroyed due to the electrostatic charge. In addition, the protective circuit 11 is connected to the logic power wiring lines 16 and 17 via the electrostatic protective circuit, like the electrostatic protective circuit ESD2 of FIG. 2. Since the electrostatic charge is discharged to the logic power wiring lines 16 and 17 included in the data line driving circuit 12a and the scanning line driving circuit 12b, additional wiring lines to discharge the electrostatic charge do not need to be provided.

Further, an electrostatic protective circuit (not shown) may be provided on the data line L1, like FIG. 2. This electrostatic protective circuit is an example of 'a data-line protective circuit' according to the invention. If doing so, the unit circuit 20 can be protected from the electrostatic charge from the data line L1 via the switching TFT 22. Further, the electrostatic destruction in the driving TFT 23 or the storage capacitor 24 can be prevented from occurring.

First Modification of Second Embodiment

Figure 13:
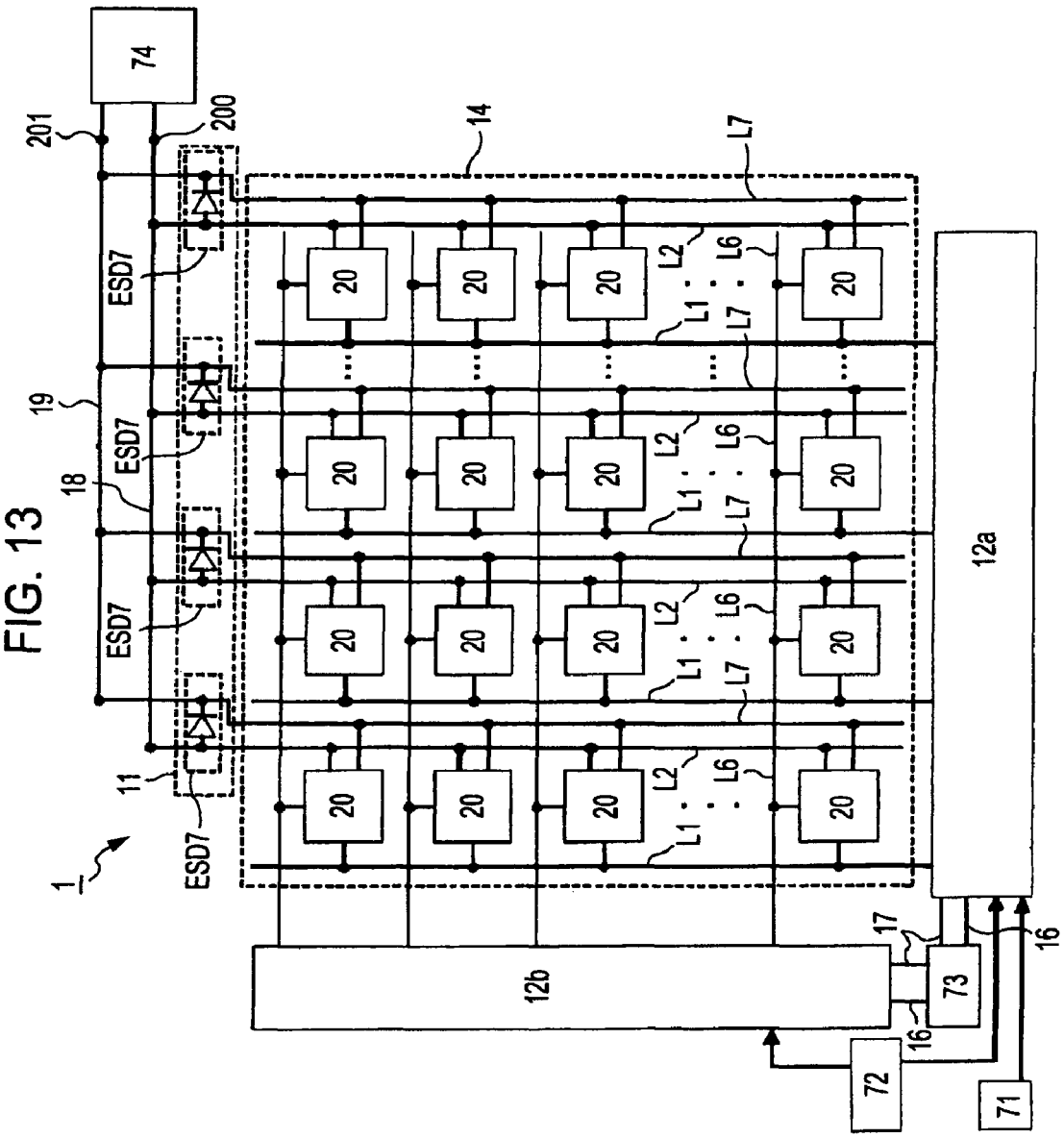
FIG. 13 is a diagram schematically showing a configuration of an organic EL device 1 according to a first modification of the second embodiment.

Next, a modification of the second embodiment will be described. Moreover, respective aspects exemplarily described below may be properly combined with one another. Further, in the respective aspects described below, the same elements as those in the second embodiment are represented by the same reference numerals as those in FIG. 12, and the descriptions thereof will be properly omitted. FIG. 13 is a diagram schematically showing a configuration of an organic EL device 1 according to a first modification of the second embodiment.

Like FIG. 2, the unit circuit 20 has a switching TFT 22, a driving TFT 23, a storage capacitor 24, and an organic EL element 29 which is an example of 'a light-emitting element' according to the invention. Further, the data line driving circuit 12a is connected to the respective unit circuits 20 via a data line L1 and the scanning line driving circuit 12b is connected to the respective unit circuits 20 via a writing selection signal line L6.

Here, the organic EL element 29 includes a first electrode, a second electrode, and a light-emitting layer interposed between the first electrode and the second electrode. The first electrode is provided to correspond to the unit circuit 20 and the second electrode is provided commonly to the plurality of unit circuits 20 which are provided in a matrix shape. The first electrode provided in the unit circuit 20 is connected to a light-emission power supply circuit 74 via a current supply line L2 and a first power wiring line 18 by means of a first power wiring line connecting terminal 200. The second electrode provided in the element forming region 14 is connected to the light-emission power supply circuit 74 via a wiring line L7 and a second power wiring line 19 by means of a second power wiring line connecting terminal 201. The second electrode and the wiring line L7 are connected to the unit circuit in the element forming region 14. The light-emission power supply circuit 74 supplies the power between the first power wiring line connecting terminal 200 and the second power wiring line connecting terminal 201. The first power wiring line 18 has first power wiring lines 18R, 18G, and 18B electrically connected to the first electrodes (anodes) of the organic EL elements which emit respective color light components. Here, for simplicity of explanation, like FIG. 2, one of the current supply lines L2 corresponding to the organic EL elements of the respective colors is shown.

The protective circuit 11 according to the modification of the second embodiment has an electrostatic protective circuit ESD7 which is provided between the first power wiring line 18 and the current supply line L2 formed in the element forming region 14. The electrostatic protective circuit ESD7 has protective elements which are provided between the first power wiring line 18 and the second power wiring line 19. The protective element is constituted by a diode, for example, like the electrostatic protective circuit ESD2. The first electrode serves as an anode and the second electrode serves as a cathode. When such a light-emitting element performs a light emission operation, the wiring line L7 and the second power wiring line 19 have a potential lower than those of the current supply line L2 and the first power wiring line 18, and thus the electrostatic protective circuit ESD7 is constituted by a diode whose input terminal is connected to the current supply line L2 and whose output terminal is connected to the wiring line L7. When the first electrode serves as the cathode and the second electrode serves as the anode, the input terminal and the output terminal of the diode are inverted.

According to such an electrostatic protective circuit 11, the electrostatic charge from the current supply line L2 or the first power wiring line connecting terminal can be discharged to the second power wiring line 19. Thus, the elements, such as the TFTs included in the unit circuit 20, can be suppressed from being destroyed due to the electrostatic charge. Therefore, even when the electrostatic charge is generated in the element forming region 14, the electrostatic charge can be discharged outside the element forming region 14 before the unexpected voltage caused by the electrostatic charge is applied to the elements included in the unit circuit 20. Further, the elements included in the unit circuit 20 can be suppressed from being destroyed due to the electrostatic charge.

Second Modification of Second Embodiment

Figure 14:
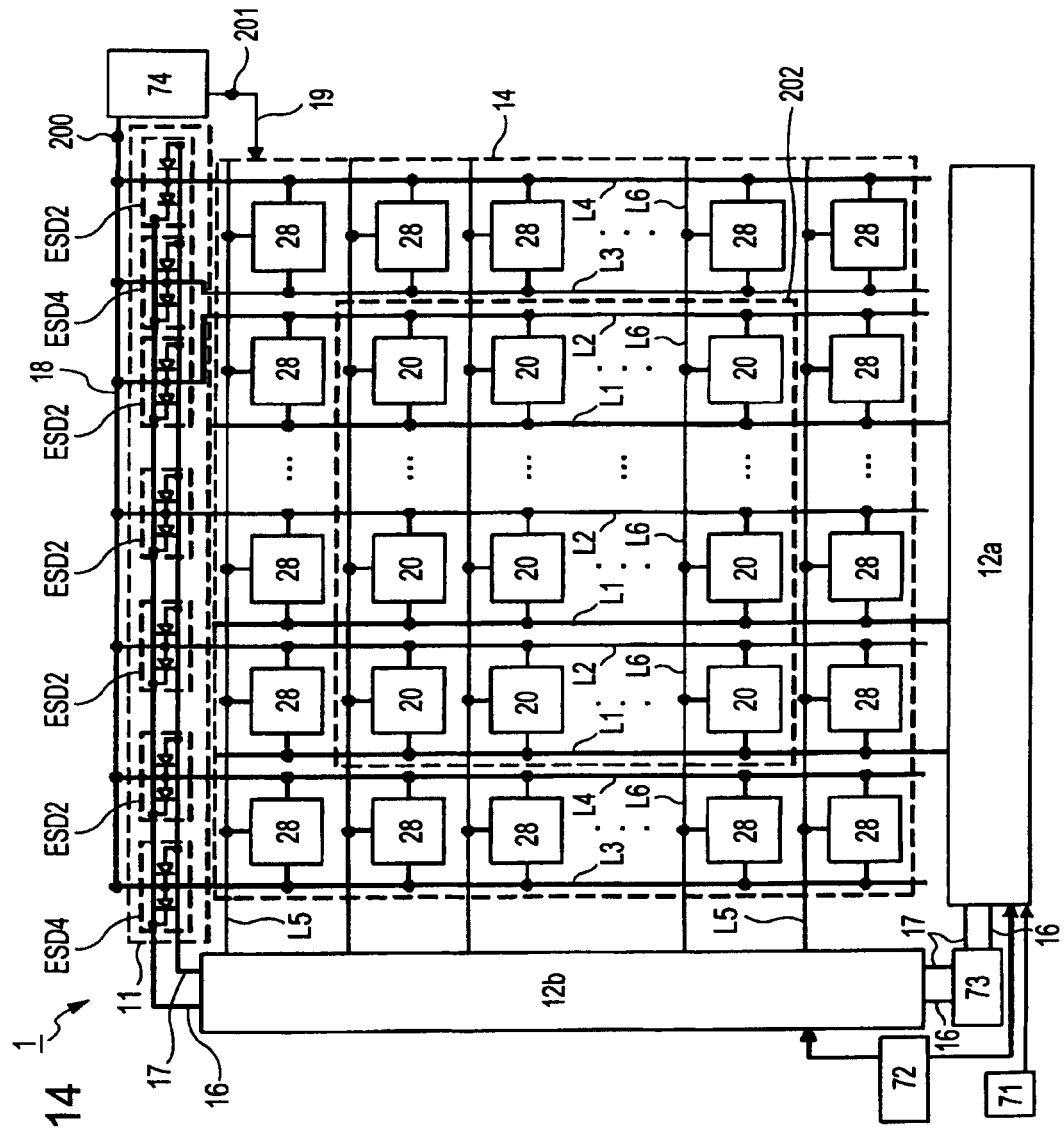
FIG. 14 is a diagram schematically showing a configuration of an organic EL device 1 according to a second modification of the second embodiment.

Next, another modification of the second embodiment will be described. Moreover, respective aspects exemplarily described below may be properly combined with one another. Further, in the respective aspects described below, the same elements as those in the second embodiment are represented by the same reference numerals as those in FIG. 12, and the descriptions thereof will be properly omitted. FIG. 14 is a diagram schematically showing a configuration of an organic EL device 1 according to a second modification of the second embodiment.

An element forming region 14 has a light-emitting region 202 in which unit circuits 20 are formed and a non-light-emitting region which is provided in a periphery of the light-emitting region 202 and in which dummy unit circuits 28 are provided. Like FIG. 2, the unit circuit 20 has a switching TFT 22, a driving TFT 23, a storage capacitor 24, and an organic EL element 29 which is an example of 'a light-emitting element' according to the invention. Further, the dummy unit circuit 28 may not include the organic EL element or may include an organic EL element which is not connected to the dummy unit circuit 28. Further, the organic EL element formed in the dummy unit circuit 28 is provided to avoid a manufacturing failure in a peripheral portion of the element forming region, in manufacturing the organic EL element. In addition, the dummy unit circuit 28 may be connected to the organic EL element, like the unit circuit 20. If doing so, the unit circuit 20 can be protected from the electrostatic charge.

In addition, the dummy unit circuits 28 are provided in a periphery of the rectangular light-emitting region 202 one by one, but a plurality of dummy unit circuits 28 may be provided therein. Further, the dummy unit circuits 28 are provided so as to surround the light-emitting region 202, but the dummy unit circuits 28 may be provided along at least one side of the light-emitting region 202.

Wiring lines L3 and L4 connected to the dummy unit circuit 28 have the same potential. Here, the wiring lines L3 and L4 are connected to a first power wiring line 18. If doing so, the electrostatic charge can be prevented from reaching the unit circuit 20 and from causing the unit circuit to be destroyed. Simultaneously, when the organic EL device 1 emits light, the dummy unit circuit can be prevented from emitting light or a leak current can be prevented from flowing.

Further, electrostatic protective circuits ESD4 and ESD2 are preferably provided on the wiring lines L3 and L4, respectively. The electrostatic protective circuits ESD2 and ESD4 are connected to logic power wiring lines 16 and 17 so as to discharge the electrostatic charge from the wiring lines L3 and L4 to the logic power wiring line 16 or 17 and to suppress the respective elements included in the dummy unit circuit 28 and the unit circuit 20 from being destroyed due to the electrostatic charge. Moreover, like FIG. 2, resistive elements R31, R32, and R41 are provided on the wiring lines L3 and L4, respectively, such that the unit circuit 20 and the dummy unit circuit 28 can be protected from the electrostatic charge more reliably.

Third Modification of Second Embodiment

Figure 15:
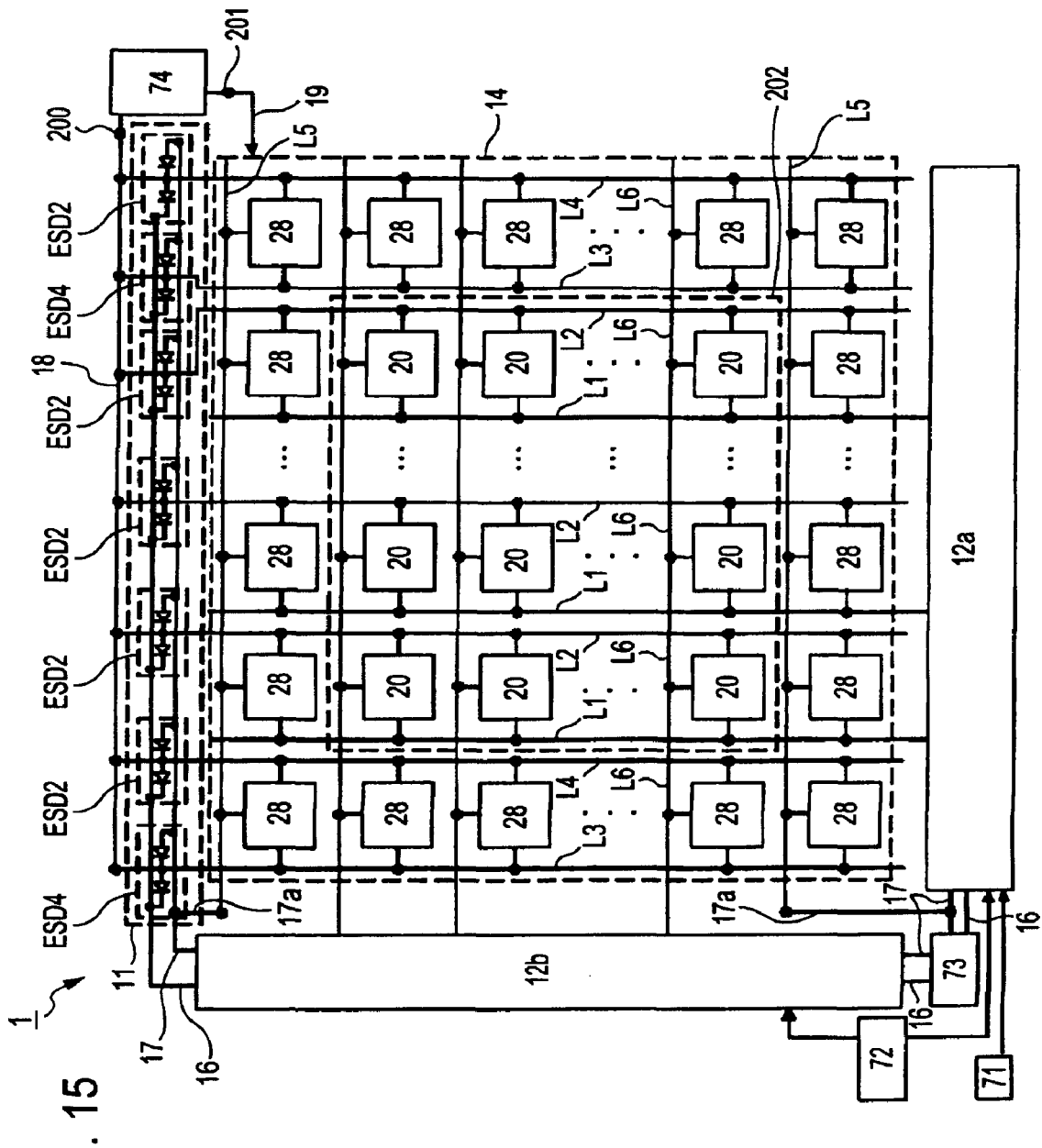
FIG. 15 is a diagram schematically showing a configuration of an organic EL device 1 according to a third modification of the second embodiment.

Next, still another modification of the second embodiment will be described. Moreover, respective aspects exemplarily described below may be properly combined with one another. Further, in the respective aspects described below, the same elements as those in the second embodiment are represented by the same reference numerals as those in FIG. 12, and the descriptions thereof will be properly omitted. FIG. 15 is a diagram schematically showing a configuration of an organic EL device 1 according to a third modification of the second embodiment.

An element forming region 14 has a light-emitting region 202 in which unit circuits 20 are formed and a non-light-emitting region which is provided in a periphery of the light-emitting region 202 and in which dummy unit circuits 28 are provided. In addition, a wiring line L5 connected to the dummy unit circuit 28 is connected to a logic power wiring line 17 via a wiring line 17a. The wiring line L5 extends parallel to a writing selection signal line L6 in the dummy unit circuit 28. If doing so, the electrostatic charge can be prevented from reaching the unit circuit 20 and from causing the unit circuit to be damaged. Simultaneously, when the organic EL device 1 emits light, the dummy unit circuit can be prevented from emitting light or a leak current can be prevented from flowing.

Third Embodiment

Figure 3:
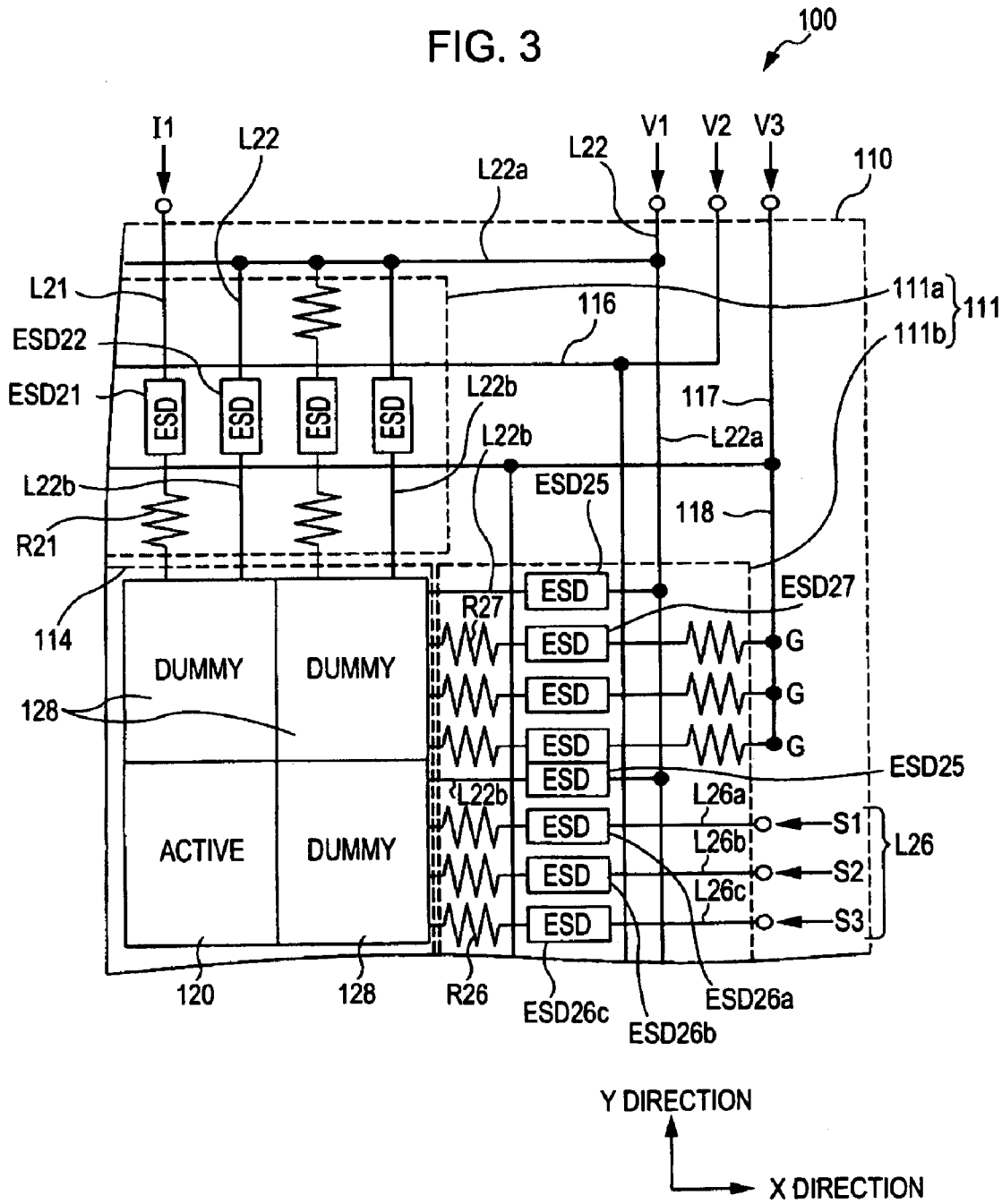
FIG. 3 is a diagram showing a configuration of a protective circuit included in an organic EL device according to a third embodiment of the invention.
Figure 4:
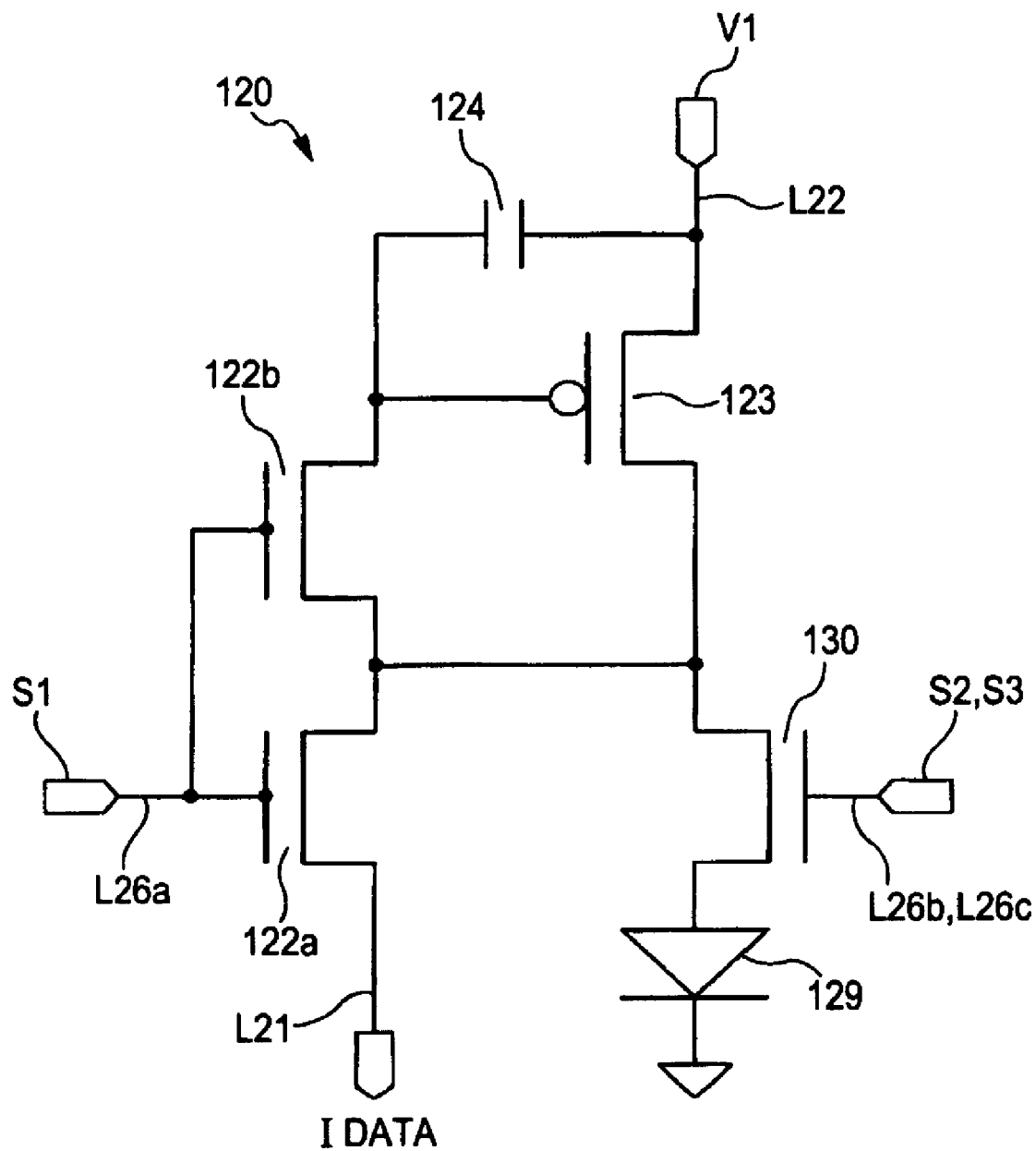
FIG. 4 is a diagram illustrating a unit circuit of the organic EL device according to the third embodiment of the invention.

Next, still another embodiment of a protective circuit of an electro-optical panel according to the invention will be described with reference to FIGS. 3 to 6. FIG. 3 is a diagram showing a configuration of a unit circuit 120 of an organic EL panel 110 according to the present embodiment. FIG. 4 is a diagram showing a part of four corners of the organic EL panel 110 in an enlarged scale. FIG. 4 also shows a configuration of a protective circuit 111.

In FIGS. 3 and 4, an organic EL device 100 according to the present embodiment has the organic EL panel 110, a current supply line L22 that supplies the driving current to an organic EL element 129, a data line L21 that supplies a data signal to the unit circuit 120, a scanning line L26 that supplies a scanning signal to the unit circuit 120, a data line driving circuit and a scanning line driving circuit (not shown), and logic power wiring lines 116 and 117 that supply power to the data line driving circuit and the scanning line driving circuit. Moreover, in the organic EL device according to the present embodiment or a fourth embodiment, the layout of the organic EL panel in the organic EL device or the protective circuit provided in the peripheral region of the organic EL panel is the same as that of the organic EL device in the first embodiment and the detailed description thereof will be omitted. In the embodiment described below, the configuration of the unit circuit and the configuration of the protective circuit will be primarily described.

(Configuration of Unit Circuit)

In FIGS. 3 and 4, the unit circuit 120 has a driving TFT 123, switching TFTs 122a, 122b, and 130, a storage capacitor 124, and the organic EL element 129.

A source of the driving TFT 123 is electrically connected to the current supply line L22 that supplies the driving current to the organic EL element 129. On the other hand, a drain thereof is electrically connected to a drain of the switching TFT 130, a drain of the switching TFT 122a, and a source of the switching TFT 122b.

A gate of the switching TFT 122a and a gate of the switching TFT 122b are electrically connected in common and are electrically connected to writing selection signal line L26b or L26c included in the scanning line 26.

A source of the switching TFT 122a is electrically connected to the data line L21 and a drain thereof is electrically connected to a source of the switching TFT 122b. Further, a drain of the switching TFT 122b is electrically connected to one end of the storage capacitor 124. The switching TFTs 122a and 122b become active when a writing selection signal S1 supplied from the writing selection signal line L26a has a high potential, that is, when the writing selection signal S1 is the H level.

The one end of the storage capacitor 124 is electrically connected to the drain of the switching TFT 122b and the other end thereof is electrically connected to the current supply line L22. The storage capacitor 124 stores charges which define a current supplied to the organic EL element 129 by the driving TFT 123.

The switching TFT 130 becomes active only when a selection signal S2 or S3 which is supplied to the selection signal line L26b or L26c electrically connected to the gate thereof is the H level and supplies the current to the organic EL element 129. A source of the switching TFT 130 is electrically connected to a first electrode (anode) of the organic EL element 129 and the drain thereof is electrically connected to the drain of the driving TFT 123.

The organic EL element 129 has the first electrode (anode), a second electrode (cathode), and an organic EL layer interposed between the first electrode and the second electrode. The organic EL element 129 is a self-emitting element which emits light with luminance according to a forward current from the first electrode toward the second electrode. Further, the first electrode of the organic EL element 129 is connected to the source of the switching TFT 130. On the other hand, the second electrode of the organic EL element 129 is common to all unit circuits 120 and is connected to a low potential (that is, reference potential) of a power supply (not shown).

The current supply line L22 supplies the driving current of the organic EL element 129 to the unit circuit 120, like the first embodiment. The data line L21 is electrically connected to an X driver and supplies a data signal I1 corresponding to the data signal to each unit circuit 120.

The scanning line L26 has the writing selection signal line L26a electrically connected to the X driver and the selection signal lines L26b and L26c. The writing selection signal line L26a is a wiring line which is provided to apply a voltage for storing the charges in the storage capacitor 124 of each pixel to the gates of the switching TFTs 122a and 122b in a programming stage described later. The selection signal lines L26b and L26c is wiring lines that supply signals for switching the switching TFT 130 of each unit circuit 120 into an active state or an inactive state.

The organic EL device 100 according to the present embodiment is a display device having organic EL elements which emit light components corresponding to wavelengths of red, green, and blue colors to perform a color display. The selection signal line L26c is a selection signal line for supplying a selection signal GELG to the unit circuit having the organic EL element which emits the green light component. The selection signal line L26b supplies the selection signal S2 to the organic EL element which emits the red light component and to the organic EL element which emits the blue light component.

Next, the operation of the organic EL device 100 having the above-described configuration will be described.

If the scanning line driving circuit supplies the writing selection signal S1 of H level to the writing selection signal line L26a, the voltage is applied to the gates of both the switching TFTs 122a and 122b in the unit circuit 120 (pixel row) corresponding to the writing selection signal S1, such that the switching TFTs 122a and 122b become active.

If the switching TFT 122b becomes active, the drain and the source of the switching TFT 122b are connected to each other, and thus the gate and the drain of the driving TFT 123 are connected to each other. Thus, the driving TFT 123 simply functions as a diode.

On the other hand, as the writing selection signal S1 of H level is supplied, the switching TFT 122b having the common gate voltage to the switching TFT 122a also becomes active. Consequently, in a period in which the writing selection signal S1 is the H level, the data signal I1 supplied by a current source in the data line driving circuit flows as a current in a path which sequentially passes through in the current supply line L22, the driving TFT 123, the switching TFT 122a, and the data line L21. In this period, a charge corresponding to a difference between the potential on the gate of the driving TFT 123 and the potential on the current supply line L22 is stored in the storage capacitor 124. The charge stored in the storage capacitor 124 defines the current which is supplied to the organic EL element 129 by the driving TFT 123. Accordingly, this period is referred to as 'a programming stage'.

If the scanning line driving circuit controls the writing selection signal S1 to the low potential (that is, the L level), the programming stage of the pixel row including the unit circuit 120 ends. As the programming stage ends (that is, the writing selection signal S1 of the L level is supplied), the switching TFTs 122a and 122b become inactive. However, since the charge is stored in the storage capacitor 124, the potential on the gate of the driving TFT 123 is maintained to a previous value.

The scanning line driving circuit supplies the selection signal S2 or S3 of the H level at a predetermined timing to the selection signal line L26b or L26c of the unit circuit 120 in which the programming state ends. If the selection signal S2 or S3 is supplied, the switching TFT 130 becomes active. Between the source and the drain of the driving TFT 123, a current based on the voltage of the gate thereof with respect to a reference potential flows. The current flows in a path which sequentially passes through the current supply line L22, the driving TFT 123, the switching TFT 130, and the organic EL element 129, such that the organic EL element 129 emits light. The emission of the organic EL element 129 is performed based on the value of the current programmed in the previous programming stage in advance, and thus an emission period of the organic EL element 129 is also referred to as 'a reproduction stage'.

The scanning line driving circuit executes the programming stage per pixel row in an element forming region 114 and simultaneously performs scanning by sequentially switching the pixel rows in which the programming stage is to be executed. The pixel row in which the programming stage ends is switched over to the reproduction stage at a predetermined delay time. The switching timing between the programming stage and the reproduction stage is properly controlled by the scanning line driving circuit, for example, such that the programming stage and the reproduction stage are not simultaneously executed in any pixel row.

As such, the organic EL device 100 drives the organic EL element 129 by the driving TFT 123, the switching TFTs 122a and 122b, the switching TFT 130, and the storage capacitor 124 according to the current programming method and performs an image display. In particular, the current supply line L22 and the data line L21 precisely perform programming of the data signal I1 by the current, and thus the unit circuit 120 is connected to the power supply or the current source with low resistance. In the organic EL device 100 according to the present embodiment, there are many cased in which the driving TFT 123 connected to the current supply line L22 and the switching TFT 122a connected to the data line L21 are destroyed due to the electrostatic charge. Therefore, it is important to prevent the unexpected voltage caused by the electrostatic charge from being applied to the current path at the time of programming and the path of the driving current when the organic EL element 129 emits light, in the current path connected to the current supply line L22 and data line L21.

(Configuration of Protective Circuit)

In FIGS. 3 and 4, the organic EL device 100 has a protective circuit 111 which is provided in a peripheral region of the element forming region 114 including the unit circuit 120 and the dummy unit circuit 128 of the organic EL panel 110.

The protective circuit 111 according to the present embodiment includes an X-side protective circuit 111a and a Y-side protective circuit 111b which are provided across the element forming region 114 in pairs in the peripheral region disposed in a periphery of the element forming region 114.

The X-side protective circuit 111a has an electrostatic protective circuit ESD22 which is provided on the current supply line L22 and electrically connected to the logic power wiring lines 116 and 117 and an electrostatic protective circuit ESD21 which is provided on the data line L21 and electrically connected to the logic power wiring lines 116 and 117. The current supply line L22 is a wiring line which supplies the driving current to the organic EL element 129 included in the unit circuit 120 and is connected to the source of the driving TFT 123 included in the unit circuit 120. The data line L21 is a signal line which supplies a current I1 corresponding to the data signal to the unit circuit 120 and is connected to the source of the switching TFT 122a included in the unit circuit 120.

The electrostatic protective circuit ESD22 provided on the current supply line L22, which is an example of 'a current supply line protective circuit' according to the invention, is electrically connected to the logic power wiring line 117 which supplies a low-potential power V3 and to the logic power wiring line 116 which supplies a high-potential power V2. Like the first embodiment, the electrostatic protective circuit ESD22 discharges the electrostatic charge from the current supply line L22 to one of the logic power wiring lines 116 and 117 according to the potential of the electrostatic charge. Therefore, the electrostatic protective circuit ESD22 discharges the electrostatic charge from the current supply line L22 to the logic power wiring line 116 or 117, and thus the driving TFT 123 included in the unit circuit 120 can be suppressed from being destroyed due to the electrostatic charge. Since the electrostatic protective circuit ESD22 does not function as an electrical resistance with respect to the driving current which is supplied from the current supply line L22 to the organic EL element 129, there is no case in which the emission of the organic EL element 129 is disturbed. Further, there is no case in which the image quality of the organic EL device 100 is degraded.

The electrostatic protective circuit ESD21 provided on the data line L21 is an example of 'a data-line protective circuit' according to the invention. Like the electrostatic protective circuit ESD22, the electrostatic protective circuit ESD21 is connected to the two logic power wiring lines 116 and 117. Like the electrostatic protective circuit ESD22, the electrostatic protective circuit ESD21 discharges the electrostatic charge from the data line L21 to the logic power wiring line 116 or 117. As a result, the switching TFT 122a included in the unit circuit 120 can be prevented from being destroyed due to the electrostatic charge.

The electrostatic protective circuit ESD21 can discharge the electrostatic charge, which is difficult to be discharged through the electrostatic protective circuit ESD22 provided on the current supply line L22, that is, the electrostatic charge from the data line L21, thereby protecting the unit circuit 120 from the electrostatic charge generated in the data line L21. Moreover, in the present embodiment, a resistive element R21 is provided on the data line L21, such that the unit circuit 120 can be protected from the electrostatic charge more reliably.

According to the electrostatic protective circuits ESD21 and ESD22, the unit circuit 120 can be protected from the electrostatic charge generated in the current supply line L22 and the data line L21, without interrupting the flows of various currents required for causing the organic EL element 129 to emit light. Therefore, the unit circuit 120 can be protected from the electrostatic charge, without degrading the image quality of the organic EL device 100.

The Y-side protective circuit 111b has electrostatic protective circuits ESD26a, ESD26b, and ESD26c which are provided on the writing selection signal line L26a and the selection signal lines L26b and L26c respectively and are electrically connected to the logic power wiring lines 116 and 117, an electrostatic protective circuit ESD25 which is provided between the current supply line L22 extending in the Y direction and the element forming region 114, and an electrostatic protective circuit ESD27 which is provided between the logic power wiring line 117 and the dummy unit circuit 128.

The respective electrostatic protective circuits ESD26a, ESD26b, and ESD26c, which are examples of 'a scanning-line protective circuit' according to the invention, have two diodes connected in series, like the above-described electrostatic protective circuits ESD11 and ESD12. The electrostatic protective circuits ESD26a, ESD26b, and ESD26c discharge the electrostatic charge from the scanning line L26 to one of the logic power wiring lines 116 and 117 according to the potential of the electrostatic charge. Therefore, the electrostatic protective circuits ESD26a, ESD26b, and ESD26c can protect the switching TFTs 122a and 122b and the switching TFT 130 from the electrostatic charge generated in the scanning line L26. Moreover, in the present embodiment, a resistive element R26 is provided on the scanning line L26, and thus the unit circuit 120 can be protected from the electrostatic charge more reliably.

A wiring line 118 is electrically connected to the low-potential logic power wiring line 117.

An electrostatic protective circuit ESD27, which is an example of 'a dummy-unit-circuit protective circuit' according to the invention, is provided between the wiring line 118 extending in the peripheral region disposed in the periphery of the element forming region 114 and the element forming region 114 to discharge the electrostatic charge from the dummy unit circuit 128 to the wiring line 118. Moreover, between the dummy unit circuit 128 and the wiring line 118, a current supply line L22a is provided so as to extend in the Y direction in the drawing. The current supply line L22a is thicker than other wiring lines, and thus the electrostatic charge is easily accumulated in the intersections of the wiring lines. Accordingly, by providing the electrostatic protective circuit ESD27 closer to the element forming region 114 than to the current supply line L22a, the unexpected voltage caused by the electrostatic charge can be suppressed from being applied to the element forming region 114. Simultaneously, the electrostatic charge from the dummy unit circuit 128 can be discharged to the wiring line 118. Moreover, in the present embodiment, a resistive element R27 is provided between the wiring line 118 and the element forming region 114, and thus the dummy unit circuit 128 can be protected from the electrostatic charge more reliably.

In the present embodiment, the current supply line L22 includes main lines L22a extending in the X direction and the Y direction in the peripheral region of the element forming region 114 and branch lines L22b extending in the element forming region 114 from the respective main line L22a. Since the unit circuits 120 are arranged in a matrix shape in the element forming region 114, the branch lines L22b extend in the element forming region 114 along the respective rows and columns of the unit circuits 120. The branch lines L22b are electrically connected to one another in the element forming region 114 and constitutes a current path for supplying the driving current of the organic EL element 129 to the respective unit circuits 120 and for discharging the electrostatic charge from the element forming region 114 to the outside. According to the layout of such branch lines L22b, the current path is set up in the element forming region 114, and thus the electrostatic charge can be discharged through the branch lines L22b to the outside.

An electrostatic protective circuit ESD25 of the Y-side protective circuit 111b discharges the electrostatic charge from the main line L22a of the current supply line L22 extending in the Y direction to the logic power wiring line 116 or 117, like the electrostatic protective circuit ESD22, thereby protecting the dummy unit circuit 128 from the electrostatic charge.

According to the protective circuit 111 according to the invention, like the protective circuit 11 according to the first embodiment, the tolerance to the electrostatic charge of the organic EL panel 110 can be increased, without significantly changing the design. Further, in the manufacturing process, the yield of the organic EL panel 110 can be enhanced. In addition, since there is no case in which the image quality of the organic EL device 100 is degraded, the yield in the manufacturing process can be enhanced, without degrading the image quality. As a result, a high-quality organic EL device can be provided.

First Modification of Third Embodiment

Figure 5:
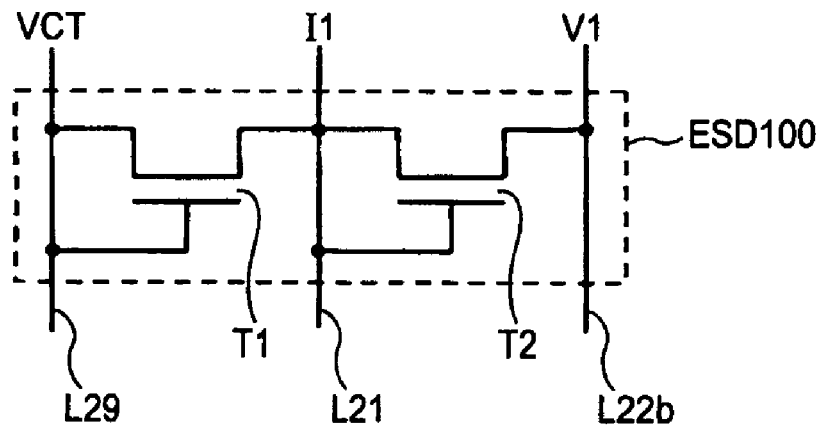
FIG. 5 is a diagram illustrating a configuration of a protective circuit included in an organic EL device according to a third embodiment of the invention.
Figure 6:
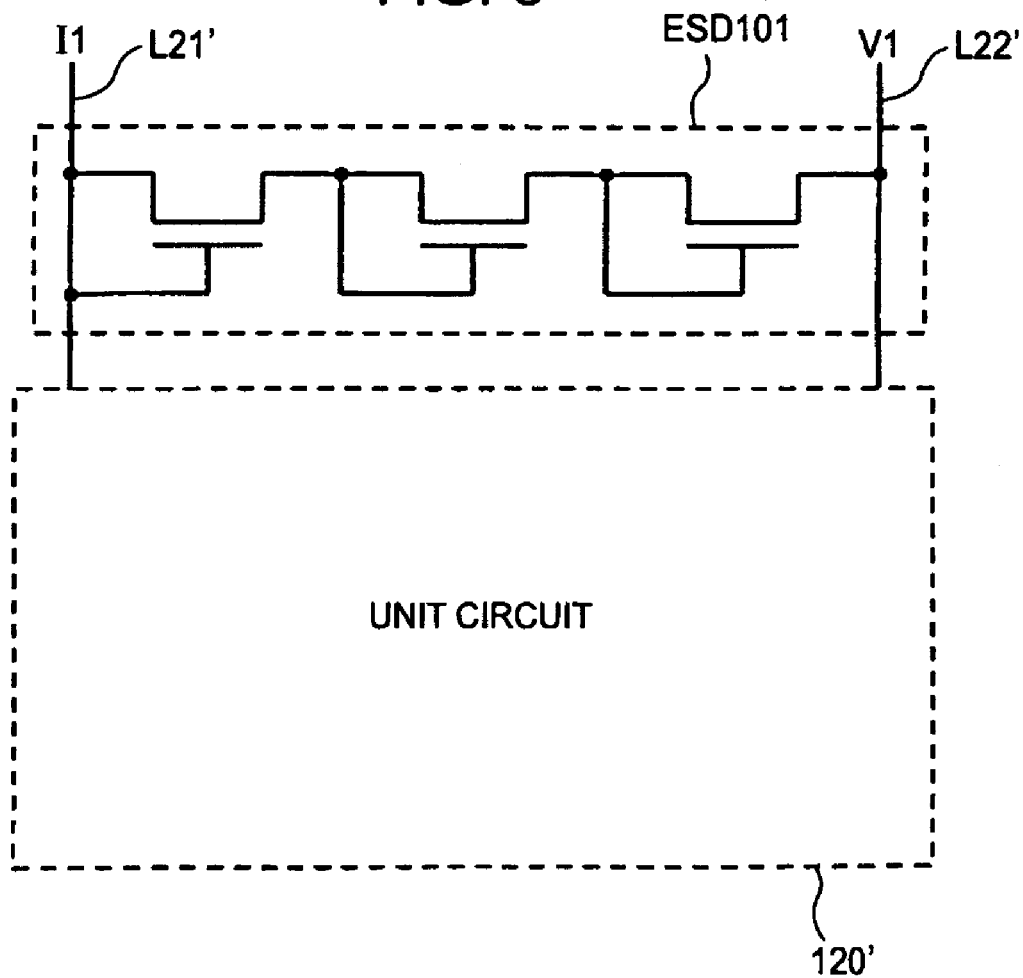
FIG. 6 is a diagram illustrating an example of a light-emitting device according to the invention.

Next, a modification of the third embodiment will be described. Moreover, respective aspects exemplarily described below may be properly combined with one another. Further, in the respective aspects described below, the same elements as those in the third embodiment are represented by the same reference numerals as those in FIGS. 3 and 4, and the descriptions thereof will be properly omitted. FIG. 5 is a diagram illustrating an example of 'a data-line protective circuit' according to the invention. FIG. 6 is a diagram illustrating a protective diode which is connected between a data line and a current supply line.

In FIG. 5, transistors T1 and T2 constitutes an example of 'a data-line protective circuit' according to the invention. The transistor T1 is electrically connected to a wiring line L29, which is electrically connected to a second electrode (cathode) side VCT of an organic EL element 29, and a data line L21. The transistor T2 is electrically connected to the data line L21 and the branch line L22b of the current supply line L22. The transistors T1 and T2 constitute an electrostatic protective circuit ESD100 which discharges the electrostatic charge from the data line L21 to at least one of the current supply line L22b and the wiring line L29. For example, the electrostatic protective circuit ESD100 extends to connect the branch line L22b which extends in the dummy unit circuit 128 to the data line L21. Here, the wiring line L29 may be connected to a ground.

Further, as shown in FIG. 6, an electrostatic protective circuit ESD101 may be connected between a data line L21' and a current supply line L22' which extend to a unit circuit 120' included in the element forming region 114. The electrostatic protective circuit ESD101 has a plurality of transistors, thereby discharging the electrostatic charge from one of the data line L21' and the current supply line L22' to the other. As such, the unit circuit 120' can be protected from the electrostatic charge more reliably.

Second Modification of Third Embodiment

Figure 16:
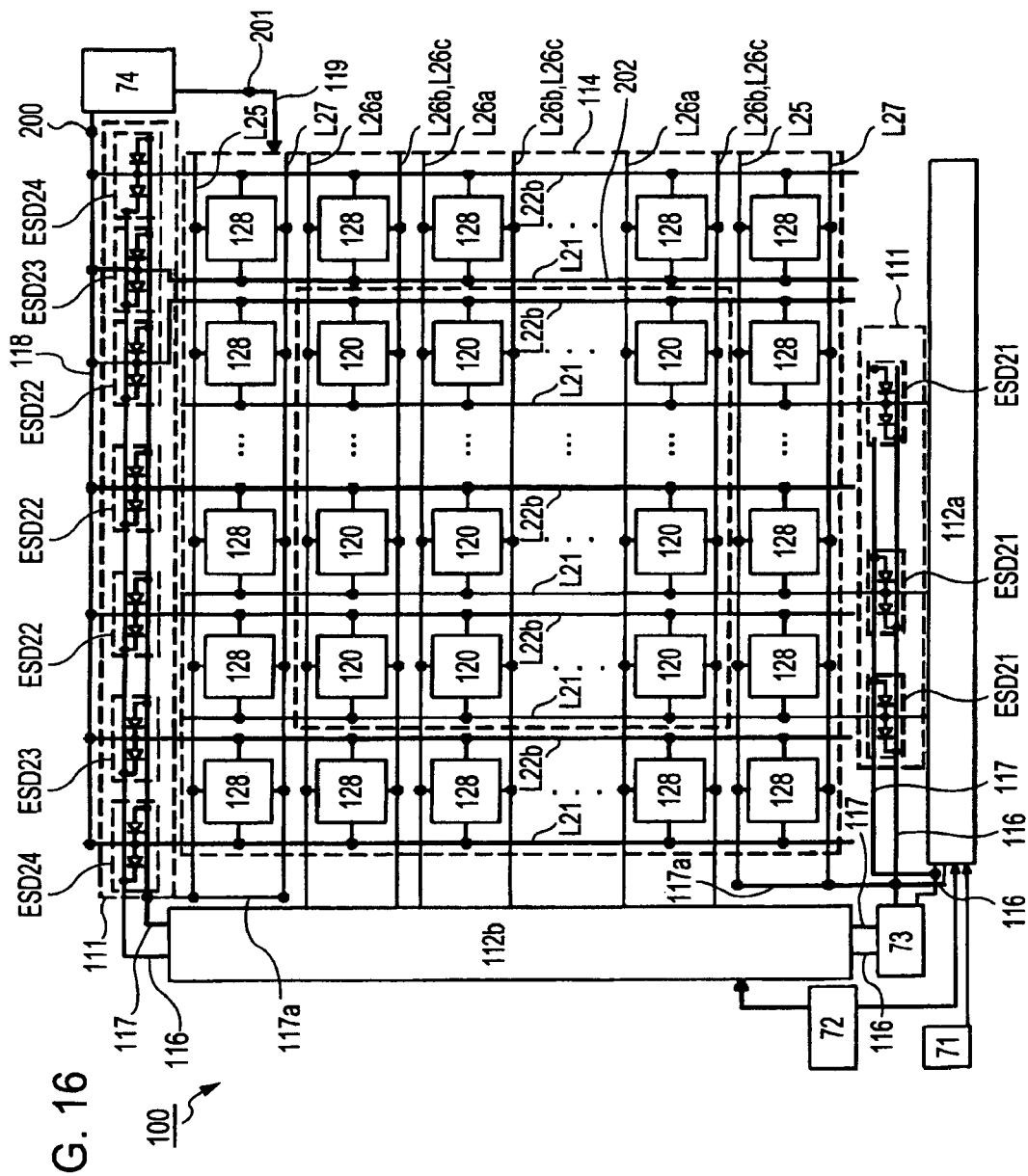
FIG. 16 is a diagram schematically showing a configuration of an organic EL device 100 according to a modification of the third embodiment.

Next, another modification of the third embodiment will be described. Moreover, respective aspects exemplarily described below may be properly combined with one another. Further, in the respective aspects described below, the same elements as those in the third embodiment are represented by the same reference numerals as those in FIGS. 3 and 4, and the descriptions thereof will be properly omitted. FIG. 16 is a diagram schematically showing a configuration of an organic EL device 100 according to another modification of the third embodiment.

In FIG. 16, the organic EL device 100 has a data line driving circuit 112a, a scanning line driving circuit 112b, a protective circuit 111, and an element forming region 114 on which unit circuits 120 are formed.

The scanning line driving circuit 112b is a circuit which supplies selection signals S1, S2, and S3, which are examples of a scanning signal, to selection signal lines L26a, L26b, and L26c.

The data line driving circuit 112a has a circuit which supplies a data signal Idata corresponding to an image signal transmitted from an image signal generating circuit 71 to a sampling circuit for sampling the image signal at a predetermined timing and a data line L21.

The operation of the scanning line driving circuit 112b and the operation of the data line driving circuit 112a are synchronized with each other by synchronization signals, such as clock signals respectively supplied from a control circuit 72 or the like. Then, light is emitted according to an active matrix method. Further, logic power wiring lines 116 and 117 supply power to the data line driving circuit 112a and the scanning line driving circuit 112b from a driving power supply circuit 73. Here, the logic power wiring line 116 supplies a high-potential power V2 and the logic power wiring line 117 supplies a low-potential power V3. Further, the logic power wiring lines 116 and 117 are connected to the protective circuit 111.

Like FIG. 4, the unit circuit 120 has a driving TFT 123, switching TFTs 122a, 122b, and 130, a storage capacitor 124, and an organic EL element 129.

Here, the organic EL element 129 includes a first electrode, a second electrode, and a light-emitting layer interposed between the first electrode and the second electrode. The first electrode is provided to correspond to the unit circuit 120 and the second electrode is provided commonly to the plurality of unit circuits 120 which are provided in a matrix shape. The first electrode provided in the unit circuit 120 is connected to a light-emission power supply circuit 74 via a current supply line L22b and a first power wiring line 118 by means of a first power wiring line connecting terminal 200. The second electrode provided in the element forming region 114 is connected to the light-emission power supply circuit 74 via a second power wiring line 119 by means of a second power wiring line connecting terminal 201. The light-emission power supply circuit 74 supplies the power between the first power wiring line connecting terminal 200 and the second power wiring line connecting terminal 201. The first power wiring line 118 has first power wiring lines 18R, 18G, and 18B electrically connected to the first electrodes (anodes) of the organic EL elements which emit respective color light components. Here, for simplicity of explanation, like FIG. 2, one of the current supply lines L22b corresponding to the organic EL elements of the respective colors is shown.

The light-emitting device according to the invention has an electrostatic protective circuit ESD22 which is an example of 'a current supply line protective circuit'. The electrostatic protective circuit ESD22 is provided between the current supply line L22b connected to the unit circuit 120 and the first power wiring line 118.

As such, according to the protective circuit 111 of another modification of the third embodiment, the unit circuit 120 can be protected from the electrostatic charge from the first power wiring line 118, the current supply line L22b, or the first power wiring line connecting terminal 200. Further, the elements, such as the switching TFT 122a and the driving TFT 123 included in the unit circuit 120, can be suppressed from being destroyed due to the electrostatic charge. In addition, like the electrostatic protective circuit ESD2 of FIG. 2, the protective circuit 111 is connected to the logic power wiring lines 116 and 117 via the electrostatic protective circuit. Since the electrostatic charge is discharged to the logic power wiring lines 116 and 117 included in the data line driving circuit 112a and the scanning line driving circuit 112b, additional wiring lines to discharge the electrostatic charge do not need to be provided.

Further, the light-emitting device according to the invention has an electrostatic protective circuit ESD21 which is an example of 'a data-line protective circuit'. The electrostatic protective circuit ESD21 is provided between the data line driving circuit 112a and the data line L21. As such, according to the protective circuit 111 of another modification of the third embodiment, the unit circuit 120 can be protected from the electrostatic charge generated in the data line L21. Further, the elements, such as the switching TFT 122a and the driving TFT 123 included in the unit circuit 120, can be suppressed from being destroyed due to the electrostatic charge. In addition, like the electrostatic protective circuit ESD2 of FIG. 2, the protective circuit 111 is connected to the logic power wiring lines 116 and 117 via the electrostatic protective circuit ESD21. Since the electrostatic charge is discharged to the logic power wiring lines 116 and 117 included in the data line driving circuit 112a and the scanning line driving circuit 112b, additional wiring lines to discharge the electrostatic charge do not need to be provided.

Further, an element forming region 114 has a light-emitting region 202 in which the unit circuits 120 are formed and a non-light-emitting region which is provided in a periphery of the light-emitting region 202 and in which the dummy unit circuits 128 are provided.

The wiring lines L21 and L22b connected to the dummy unit circuit 128 has the same potential. Here, the wiring lines L21 and L22b are connected to the first power wiring line 118. If doing so, the electrostatic charge can be prevented from reaching the unit circuit 120 and from causing the unit circuit 120 to be destroyed. Further, when the organic EL device 100 emits light, the dummy unit circuit can be prevented from emitting light or the leak current can be prevented from flowing.

Further, electrostatic protective circuits ESD24 and ESD23 are preferably provided on the wiring lines L21 and L22b respectively. The electrostatic protective circuits ESD24 and ESD23 are examples of 'a dummy-unit-circuit protective circuit'. The electrostatic protective circuits ESD24 and ESD23 are connected to the logic power wiring lines 116 and 117 to discharge the electrostatic charge from the wiring lines L21 and L22b to the logic power wiring line 116 or 117 and to suppress the respective elements included in the dummy unit circuit 128 and the unit circuit 120 from being destroyed due to the electrostatic charge. Moreover, like FIG. 2, resistive elements are provided on the wiring lines L21 and L22b respectively, and thus the unit circuit 120 and the dummy unit circuit 128 can be protected from the electrostatic charge more reliably.

In addition, a wiring line L27 connected to the dummy unit circuit 128 is connected to the logic power wiring line 117 via a wiring line 117a. If doing so, the electrostatic charge can be prevented from reaching the unit circuit 120 and from causing the unit circuit to be destroyed. Further, when the organic EL device 100 emits light, the dummy unit circuit 128 can be prevented from emitting light or the leak current can be prevented from flowing.

Third Modification of Third Embodiment

Figure 17:
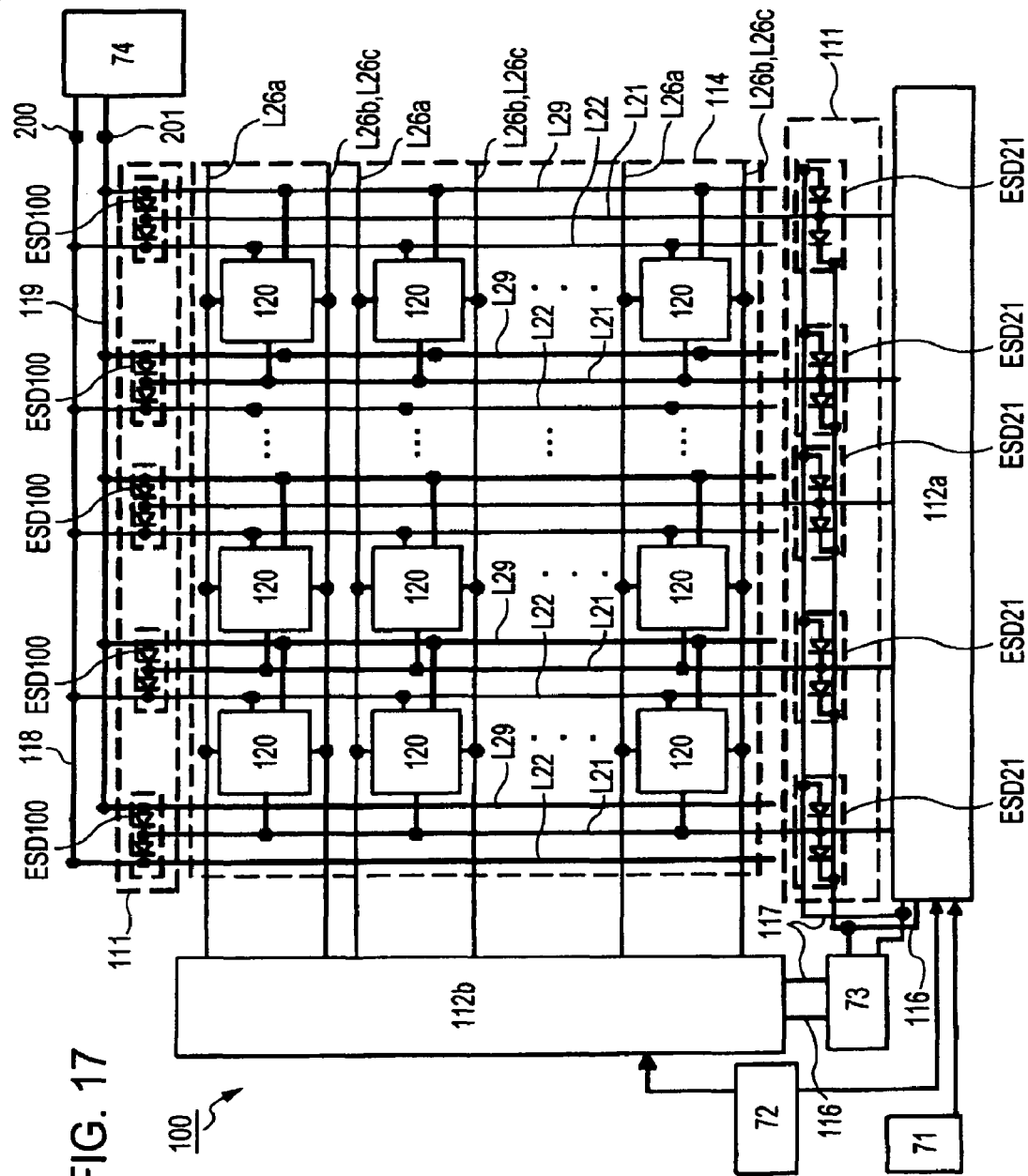
FIG. 17 is a diagram schematically showing a configuration of an organic EL device 100 according to another modification of the third embodiment.

Next, still another modification of the third embodiment will be described. Moreover, respective aspects exemplarily described below may be properly combined with one another. Further, in the respective aspects described below, the same elements as those in the third embodiment are represented by the same reference numerals as those in FIGS. 3 and 4, and the descriptions thereof will be properly omitted. FIG. 17 is a diagram schematically showing a configuration of an organic EL device 100 according to still another modification of the third embodiment.

In FIG. 17, the organic EL device 100 has a data line driving circuit 112a, a scanning line driving circuit 112b, a protective circuit 111, and an element forming region 114 on which unit circuits 120 are formed.

Further, logic power wiring lines 116 and 117 supply power to the data line driving circuit 112a and the scanning line driving circuit 112b from a driving power supply circuit 73. Here, the logic power wiring line 116 supplies a high-potential power V2 and the logic power wiring line 117 supplies a low-potential power V3. Further, the logic power wiring lines 116 and 117 are connected to the protective circuit 111.

Like FIG. 4, the unit circuit 120 has a driving TFT 123, switching TFTs 122a, 122b, and 130, a storage capacitor 124, and an organic EL element 129.

Here, the organic EL element 129 includes a first electrode, a second electrode, and a light-emitting layer interposed between the first electrode and the second electrode. The first electrode is provided to correspond to the unit circuit 120 and the second electrode is provided commonly to the plurality of unit circuits 120 which are provided in a matrix shape. The first electrode provided in the unit circuit 120 is connected to a light-emission power supply circuit 74 via a current supply line L22 and a first power wiring line 118 by means of a first power wiring line connecting terminal 200. The second electrode provided in the element forming region 114 is connected to the light-emission power supply circuit 74 via a wiring line L29 and a second power wiring line 119 by means of a second power wiring line connecting terminal 201. The light-emission power supply circuit 74 supplies power between the first power wiring line connecting terminal 200 and the second power wiring line connecting terminal 201. The first power wiring line 118 has first power wiring lines 18R, 18G, and 18B electrically connected to the first electrodes (anodes) of the organic EL elements which emit respective color light components. Here, for simplicity of explanation, like FIG. 2, one of the current supply lines L22 corresponding to the organic EL elements of the respective colors is shown.

The light-emitting device according to the invention has an electrostatic protective circuit ESD100 which is an example of 'a data-line protective circuit'. The electrostatic protective circuit ESD100 is connected to a data line L21 and has a diode provided between the first power wiring line 118 and the data line L21 and a diode provided between the second power wiring line 119 and the data line L21.

According to such a protective circuit 111, the unit circuit 120 can be protected from the electrostatic charge from the data line L21. Further, the elements, such as the switching TFT 122a and the driving TFT 123 included in the unit circuit 120, can be suppressed from being destroyed due to the electrostatic charge. In addition, the protective circuit 111 is connected to the current supply line L22 and the wiring line L29. Since the electrostatic charge is discharged to the current supply line L22 and the wiring line L29, additional wiring lines to discharge the electrostatic charge do not need to be provided. Further, the diodes are provided between the current supply line L22 formed in the element forming region 114 and the first power wiring line 118 and between the wiring line L29 formed in the element forming region 114 and the second power wiring line 119, respectively. Here, the first power wiring line 118 supplies the current to a plurality of current supply lines L22 and the second power wiring line 119 supplies the current to a plurality of wiring lines L29. Therefore, the first power wiring line 118 has low resistance as compared to one current supply line L22. When the same wiring line is used, the line width of the first power wiring line 118 is larger than that of the current supply line L22. Similarly, the second power wiring line 119 has low resistance as compared to one wiring line L29. When the same wiring line is used, the line width of the second power wiring line 119 is larger than that of the wiring line L29. Even when the electrostatic charge is accumulated in the data line L21, the electrostatic charge can be immediately dissolved from the first power wiring line 118 or the second power wiring line 119.

Fourth Embodiment

Figure 7:
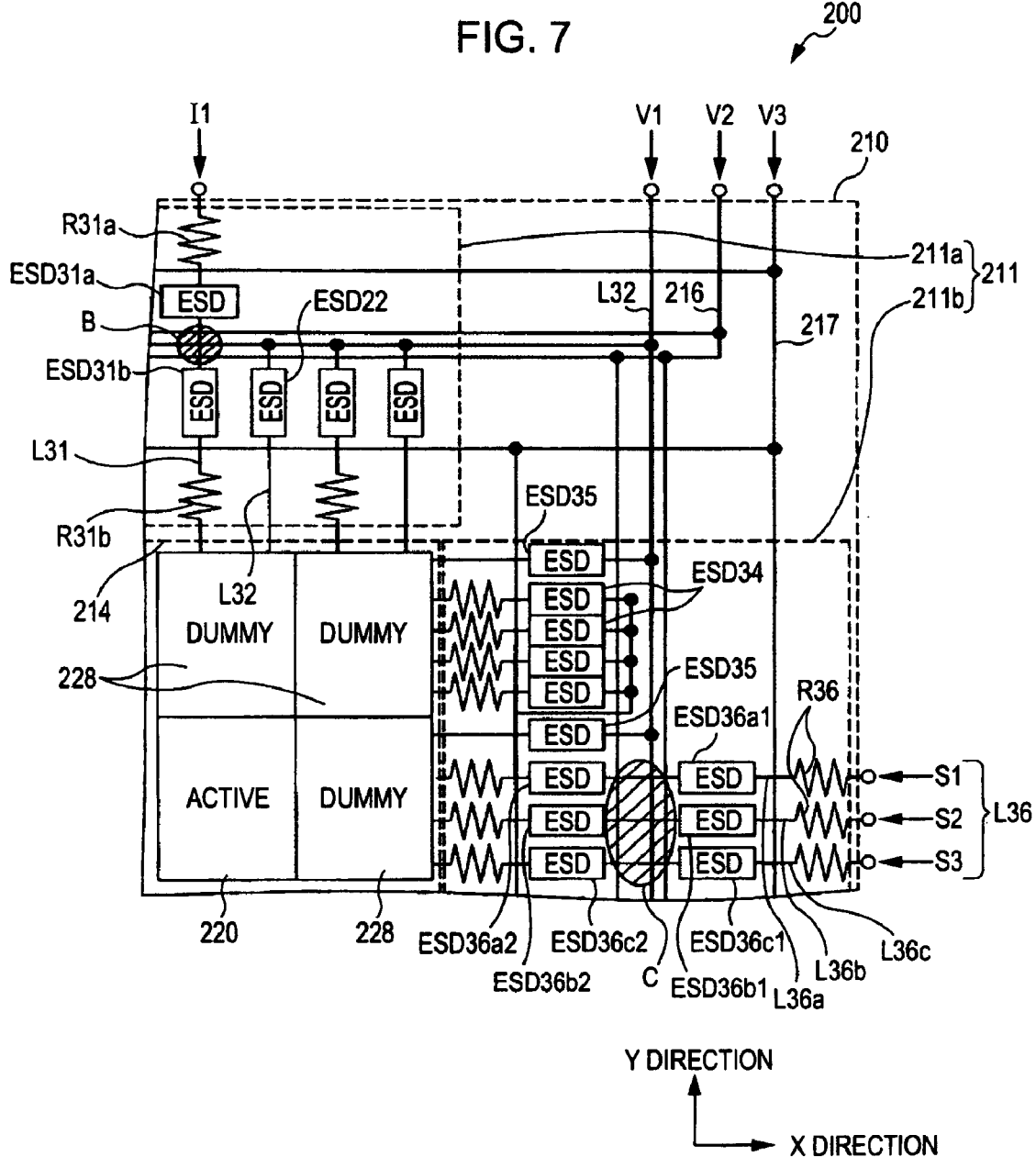
FIG. 7 is a diagram showing a configuration of a protective circuit included in an organic EL device according to a fourth embodiment of the invention.
Figure 8:
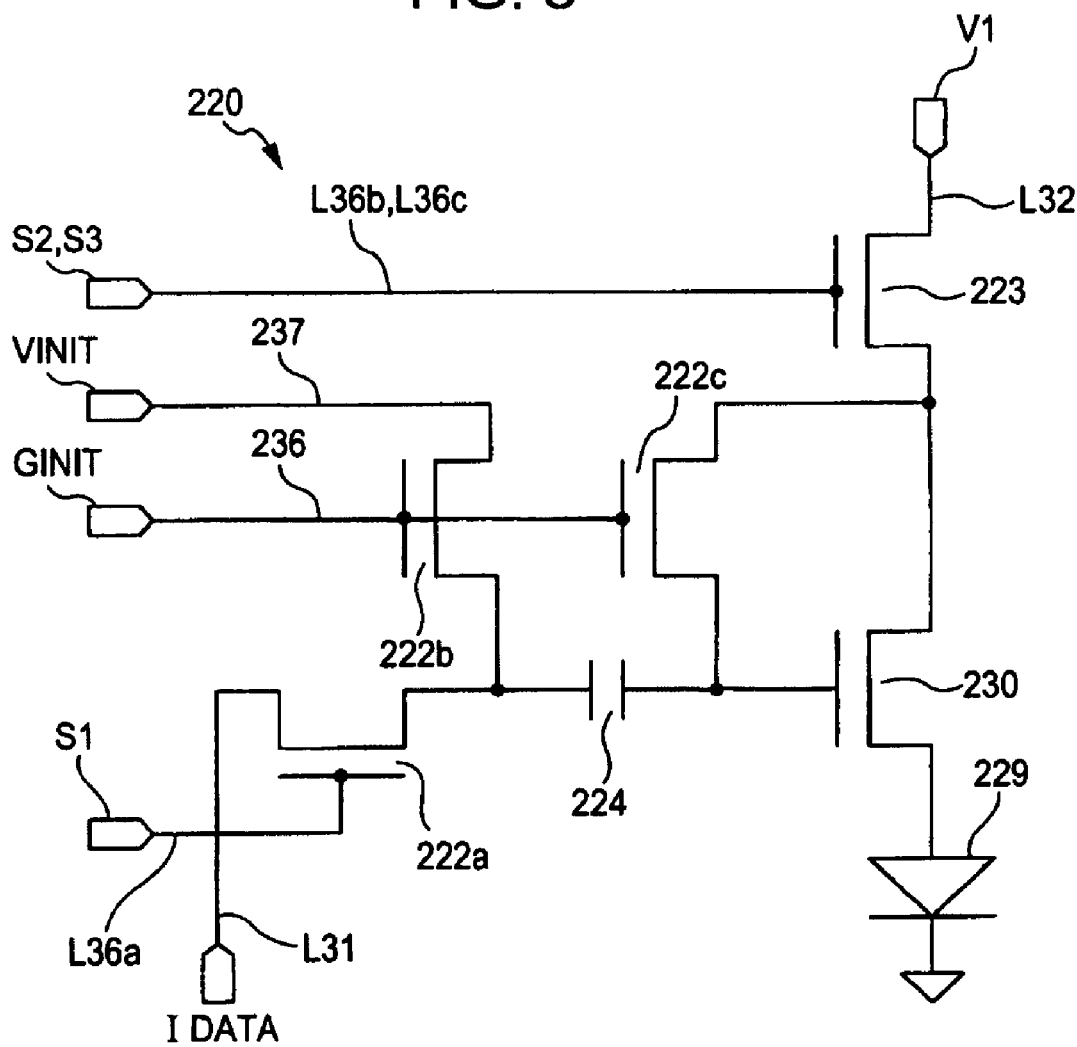
FIG. 8 is a diagram illustrating a unit circuit of the organic EL device according to the fourth embodiment of the invention.

Next, a further embodiment of a light-emitting device according to the invention will be described with reference to FIGS. 7 and 8. FIG. 7 is a diagram showing a configuration of a unit circuit 220 of an organic EL device 200 according to the present embodiment. FIG. 8 is a diagram showing a portion of four corners of an organic EL panel 210 in an enlarged scale. FIG. 8 also shows a configuration of a protective circuit 211.

The organic EL device 200 according to the present embodiment has the organic EL panel 210, a current supply line L32 that supplies the driving current to an organic EL element 229, data line L31 that supply data signals to unit circuits 220, scanning lines L36 that supply scanning signals to the unit circuits 220, a data line driving circuit and a scanning line driving circuit (not shown), and logic power wiring lines 216 and 217 that supply power to the data line driving circuit and the scanning line driving circuit.

(Configuration of Unit Circuit)

In FIGS. 7 and 8, the unit circuit 220 has TFTs 222a, 222b, 222c, and 223, which serve as first to fourth switching elements, a driving TFT 230, a storage capacitor 224, which serves as a capacitive element, and the organic EL element 229.

A source of the driving TFT 230 is connected to a first electrode (anode) of the organic EL element 229 and a source of the switching TFT 223 is connected to a drain of the driving TFT 230 and one end (drain) of the switching TFT 222c. Here, a gate of the switching TFT 223 is connected to a selection signal line L36b or L36c. For this reason, when the selection signal S2 or S3 is the H level, the switching TFT 223 becomes active. When the selection signal S2 or S3 is the L level, the switching TFT 223 becomes inactive.

The source of the driving TFT 230 is connected to the first electrode (anode) of the organic EL element 229. On the other hand, the organic EL element 229 is electrically inserted in a path between the current supply line L32 and the second electrode side (VCT) of the organic EL element 229, together with the switching TFT 223 and the driving TFT 230.

A gate of the driving TFT 230 is connected to one end of the storage capacitor 224 and a source of the switching TFT 222c.

The switching TFT 222c is electrically inserted between the drain and the gate of the driving TFT 230 and simultaneously, a gate of the switching TFT 222c is connected to a control line 236. For this reason, when a control signal GINIT is the H level, the switching TFT 222c is turned-on, such that the driving TFT 230 functions as a diode.

On the other hand, one end (drain) of the switching TFT 222b is connected to a feeding line 237, while the other end (source) is connected to one end (drain) of the switching TFT 222a and the other end of the storage capacitor 224. A gate of the switching TFT 222b is connected to the control line 236. For this reason, when the control signal GINIT is the H level, the switching TFT 222b becomes active.

In addition, the other end (source) of the switching TFT 222a is connected to the data line L31 and a gate thereof is connected to a writing signal line L36a included in the scanning line L36. For this reason, when a writing selection signal S1 is the H level, the switching TFT 222a becomes active to supply the data signal, which is supplied to the data line L31, to the storage capacitor 224.

The unit circuit 220 has a configuration in which switching operations to switch the switching TFTs 222b and 222c into the active state and the inactive state are controlled in common by the control signal GINIT supplied to the control line 236. Like the second embodiment, the unit circuit 220 can cause the organic EL element 229 to emit light according to a voltage programming method. In addition, the unit circuit 220 can cause the required driving current to flow in the organic EL element 229, without depending on a variation in threshold voltage of the driving TFT 230. In the unit circuit 220, before a voltage applied to the gate of the driving TFT 230 is maintained, the control signal GINIT of the H level is supplied and the switching TFTs 222b and 222c become active, such that both ends of the storage capacitor 224 are initialized. Simultaneously, the driving TFT 230 functions as the diode, and thus the gate potential of the driving TFT 230 has a value according to the threshold voltage of the driving TFT 230. After the control signal GINIT of the L level is supplied and the switching TFTs 222b and 222c become inactive, the switching TFT 222a becomes active, and thus the data signal from the data line L31 is maintained as the gate voltage of the driving TFT 230. When the organic EL element 229 emits light, a voltage according to the potential of the charge stored in the storage capacitor 224 is applied to the gate of the driving TFT 230, such that the driving current flows in the organic EL element 229. In the organic EL device 200, the electrostatic charge may be easily caused in the current supply line L32. Therefore, it is important to suppress the switching TFTs 223 and the driving TFT 230 connected to the current supply line L32 and the switching TFT 222a connected to the data line L31 from being destroyed due to the electrostatic charge.

(Configuration of Protective Circuit)

The protective circuit 211 of the organic EL device 200 will be described in detail with reference to FIG. 7.

In FIG. 7, the organic EL device 200 has the protective circuit 211 which is provided in a peripheral region of an element forming region 214. In the element forming region 214, the unit circuits 220 and dummy unit circuits 228 are provided.

The protective circuit 211 according to the present embodiment includes an X-side protective circuit 211a and a Y-side protective circuit 211b which are provided across the element forming region 214 in pairs in the peripheral region disposed in a periphery of the element forming region 214. Moreover, a portion of four corners of the organic EL panel 210 in the protective circuit 211 will be described in detail.

The X-side protective circuit 211a has an electrostatic protective circuit ESD32 which is provided on the current supply line L32 and electrically connected to the logic power wiring lines 216 and 217 and electrostatic protective circuits ESD31a and ESD31b which are provided on the data line L31 and electrically connected to the logic power wiring lines 216 and 217.

The current supply line L32 is connected to the source of the switching TFT 223 included in the unit circuit 220 to supply the driving current to the organic EL element 229 included in the unit circuit 220. The data line L31 is the data line which supplies the data signal to the unit circuit 220 and is connected to the source of the switching TFT 222a included in the unit circuit 220.

The electrostatic protective circuit ESD32 provided on the current supply line L32, which is an example of 'a current supply line protective circuit' according to the invention, is electrically connected to the logic power wiring line 217 which supplies a low-potential power and the logic power wiring line 216 which supplies a high-potential power. The electrostatic protective circuit ESD32 has two diodes connected in series and, like the electrostatic protective circuit described in the first embodiment or the third embodiment, discharges the electrostatic charge from the current supply line L32 to one of the logic power wiring lines 216 and 217 according to the potential of the electrostatic charge. Therefore, according to the electrostatic protective circuit ESD32, the switching TFT 223 and the driving TFT 230 can be prevented from being destroyed due to the electrostatic charge. Since the electrostatic protective circuit ESD32 does not function as an electrical resistance with respect to the driving current supplied from the current supply line L32 to the organic EL element 229, there is no case in which the emission of the organic EL element 229 is disturbed. Further, there is no case in which the image quality of the organic EL device 200 is degraded.

The electrostatic protective circuits ESD31a and ESD31b provided on the data line L31 are examples of 'a data-line protective circuit' according to the invention. The electrostatic protective circuits ESD31a and ESD31b are connected to the logic power wiring lines 216 and 217. Like the first embodiment and the second embodiment, the electrostatic protective circuits ESD31a and ESD31b discharge the electrostatic charge from the data line L31 to one of the logic power wiring lines 116 and 117. As a result, the switching TFT 222a included in the unit circuit 220 can be prevented from being destroyed due to the electrostatic charge.

The two electrostatic protective circuits ESD31a and ESD31b are provided on the data line L31 across an intersection B of the current supply line L32 extending in the X direction and the data line L31 extending in the Y direction in the peripheral region of the element forming region 214. The intersection B of the current supply line L32 and the data line L31 is a region in which the electrostatic charge is easily accumulated. According to the two electrostatic protective circuits ESD31a and ESD31b, the electrostatic charge accumulated in the intersection can be discharged to the logic power wiring line 216 or 217. Further, the switching TFT 223 and the switching TFT 222a included in the unit circuit 220 can be suppressed from being destroyed due to the electrostatic charge. Moreover, in the present embodiment, resistive elements R31a and R31b are also provided on the data line L31, such that the unit circuit 220 can be protected from the electrostatic charge more reliably.

According to the electrostatic protective circuits ESD32, ESD31a, and ESD31b, the unit circuit 220 can be protected from the electrostatic charge from the current supply line L32 and the data line L31, without interrupting the flows of various currents required for causing the organic EL element 229 to emit light. Therefore, the unit circuit 220 can be protected from the electrostatic charge, without degrading the image quality of the organic EL device 200.

The Y-side protective circuit 211b has electrostatic protective circuits ESD36a1, ESD36a2, ESD36b1, ESD36b2, ESD36c1, and ESD36c2 which are provided on a writing selection signal line L36a and selection signal lines L36b and L36c respectively and are electrically connected to the logic power wiring lines 216 and 217, an electrostatic protective circuit ESD35 which is provided between the current supply line L32 and the element forming region 214, and an electrostatic protective circuit ESD34 which is provided between the logic power wiring line 217 and the dummy unit circuit 228.

The respective electrostatic protective circuits ESD36a1, ESD36a2, ESD36b1, ESD36b2, ESD36c1, and ESD26c are examples of 'a scanning-line protective circuit' according to the invention. The electrostatic protective circuits ESD36a1 and ESD36a2 can protect the switching TFT 222a from the electrostatic charge generated in the writing selection signal line L36a. Similarly, the electrostatic protective circuits ESD36b1, ESD36b2, ESD36c1, and ESD36c2 can discharge the electrostatic charge from the selection signal lines L36b and L36c to one of the logic power wiring lines 216 and 217. Therefore, according to the electrostatic protective circuits ESD36a1, ESD36a2, ESD36b1, ESD36b2, ESD36c1, and ESD36c2, the respective elements included in the unit circuit 220 can be prevented from being destroyed due to the electrostatic charge. Moreover, in the present embodiment, a resistive element R36 is also provided on the scanning line L36, and thus the unit circuit 220 can be protected from the electrostatic charge more reliably.

The electrostatic protective circuits ESD36a1 and ESD36a2 are arranged across an intersection C of the writing selection signal line L36a and the current supply line L32 between the electrostatic protective circuits ESD36a1 and ESD36a2. Similarly, the electrostatic protective circuits ESD36b1, ESD36b2, ESD36c1, and ESD36c2 are also arranged across the intersections C of the current supply line L32 and the selection signal lines L36b and L36c. The electrostatic protective circuits ESD36a1, ESD36a2, ESD36b1, ESD36b2, ESD36c1, and ESD36c2 can discharge the electrostatic charge accumulated in the intersection C of the current supply line L32 and the scanning line L36, such that the unexpected voltage caused by the electrostatic charge is not applied to the unit circuit 220 or the dummy unit circuit 228.

The electrostatic protective circuit ESD34 connected to the low-potential logic power wiring line 217 discharges the electrostatic charge from the dummy unit circuit 228 to the logic power wiring line 217 to suppress the dummy unit circuit 228 from being destroyed due to the electrostatic charge. Moreover, between the dummy unit circuit 228 and the wiring line 217, the current supply line L32 extends in the Y direction in the drawing. The current supply line L32 is thicker than other wiring lines, and thus the electrostatic charge may be easily accumulated in the intersections of the wiring lines. Accordingly, by providing the electrostatic protective circuit ESD34 closer to the element forming region 214 than to the current supply line L32, the unexpected voltage caused by the electrostatic charge can be suppressed from being applied to the element forming region 214. Simultaneously, the electrostatic charge from the dummy unit circuit 228 can be discharged to the logic power wiring line 216 or 217.

In the present embodiment, the current supply line L32 includes a main line in the peripheral region of the element forming region 214 and branch lines that extend from the main line to the element forming region 214, like the second embodiment. Therefore, with a current path through which the electrostatic charge generated in the element forming region 214 is discharged to the outside, the unit circuit 220 can be suppressed from being destroyed due to the electrostatic charge generated in the element forming region 214.

According to the protective circuit 211 of the present embodiment, like the protective circuit in the first embodiment or the second embodiment, the tolerance to the electrostatic charge of the organic EL panel can be increased, without significantly changing the design. Further, in the manufacturing process, the yield of the organic EL panel can be enhanced. In addition, since there is no case in which the image quality of the organic EL device is degraded, the yield in the manufacturing process can be enhanced, without degrading the image quality. As a result, a high-quality organic EL device can be provided.

Modification of Fourth Embodiment

Figure 18:
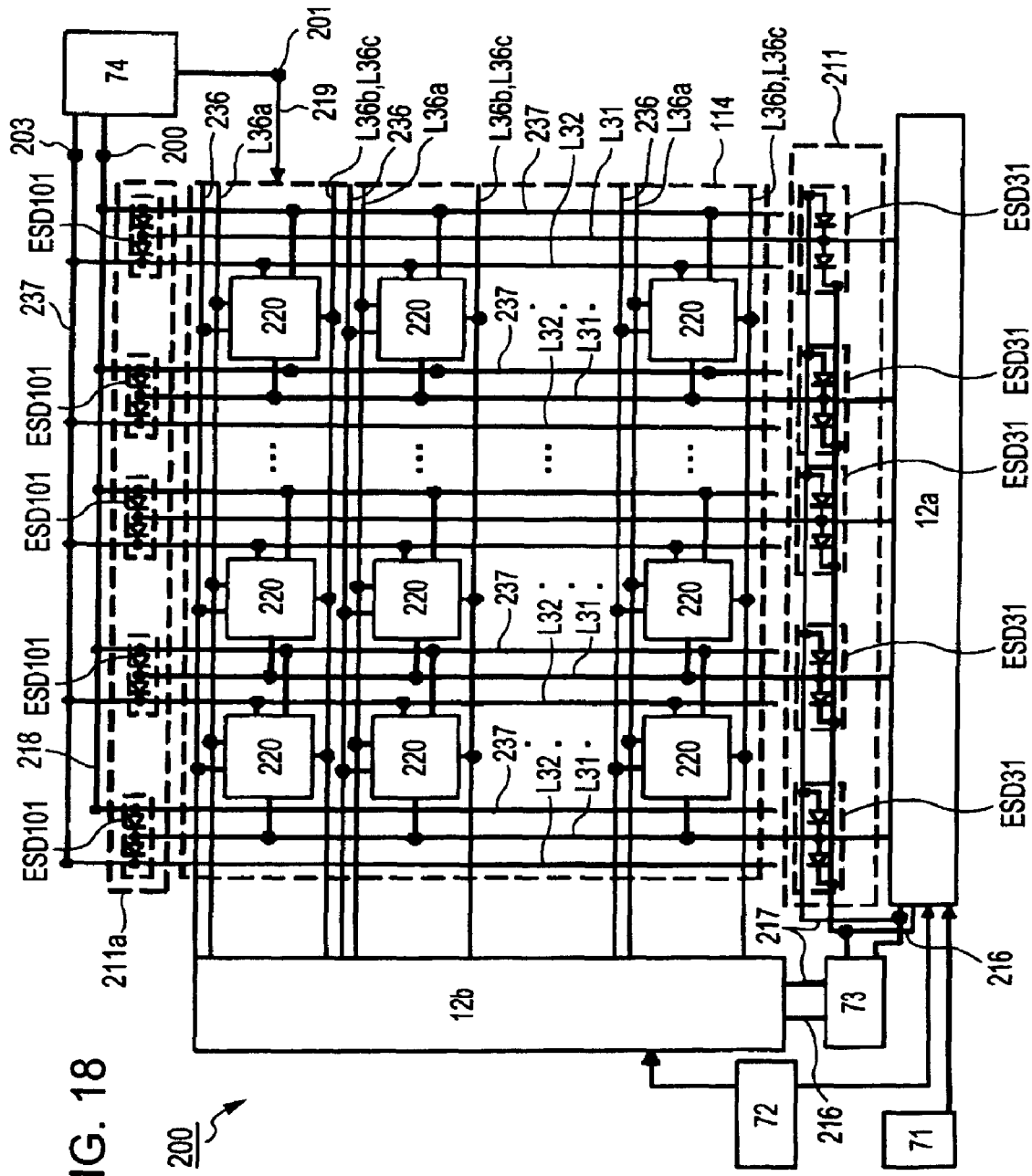
FIG. 18 is a diagram schematically showing a configuration of an organic EL device 200 according to a modification of the fourth embodiment.

Next, a modification of the fourth embodiment will be described. Moreover, respective aspects exemplarily described below may be properly combined with one another. Further, in the respective aspects described below, the same elements as those in the fourth embodiment are represented by the same reference numerals as those in FIGS. 7 and 8, and the descriptions thereof will be properly omitted. FIG. 18 is a diagram schematically showing a configuration of an organic EL device 200 according to the modification of the fourth embodiment.

In FIG. 18, the organic EL device 200 has a data line driving circuit 12a, a scanning line driving circuit 12b, a protective circuit 211, and an element forming region 214 in which unit circuits 220 are formed.

Further, logic power wiring lines 216 and 217 supply power to the data line driving circuit 12a and the scanning line driving circuit 12b from a driving power supply circuit 73. Here, the logic power wiring line 216 supplies a high-potential power V2 and the logic power wiring line 217 supplies a low-potential power V3. Further, the logic power wiring lines 216 and 217 are connected to the protective circuit 211.

Like FIG. 8, the unit circuit 220 has TFTs 222a, 222b, 222c, and 223, which serve as first to fourth switching elements, a driving TFT 230, a storage capacitor 224, which serves as a capacitive element, and an organic EL element 229.

Here, the organic EL element 229 includes a first electrode, a second electrode, and a light-emitting layer interposed between the first electrode and the second electrode. The first electrode is provided to correspond to the unit circuit 220 and the second electrode is provided commonly to the plurality of unit circuits 220 which are provided in a matrix shape. The first electrode provided in the unit circuit 220 is connected to a light-emission power supply circuit 74 via the current supply line L32 and a first power wiring line 218 by means of a first power wiring line connecting terminal 200. The second electrode provided in the element forming region 214 is connected to the light-emission power supply circuit 74 via a second power wiring line 219 by means of a second power wiring line connecting terminal 201. The light-emission power supply circuit 74 supplies the power between the first power wiring line connecting terminal 200 and the second power wiring line connecting terminal 201. Further, a wiring line 237, to which the power VINIT is supplied, is also connected to the light-emission power supply circuit 74 by a third power wiring line connecting terminal 203. The first power wiring line 218 has first power wiring lines 18R, 18G, and 18B electrically connected to the first electrodes (anodes) of the organic EL elements which emit respective color light components. Here, for simplicity of explanation, like FIG. 2, one of the current supply lines L32 corresponding to the organic EL elements of the respective colors is shown.

The light-emitting device according to the invention has an electrostatic protective circuit ESD101, which is an example of 'a data-line protective circuit'. The electrostatic protective circuit ESD101 is connected to a data line L31 and has a diode provided between the current supply line L32 and the data line L31 and a diode provided between the wiring line 237 and the data line L31.

According to such a protective circuit 211, the unit circuit 220 can be protected from the electrostatic charge generated in the data line L31. Further, the elements, such as the switching TFT 222a and the driving TFT 230 included in the unit circuit 220, can be suppressed from being destroyed due to the electrostatic charge. In addition, the protective circuit 211 is connected to the current supply line L32 and the wiring line 237. Since the electrostatic charge is discharged to the current supply line L32 and the wiring line 237, additional wiring lines to discharge the electrostatic charge do not need to be provided.

Moreover, in addition to the configuration of the pixel circuit described with reference to FIGS. 1 to 18, the same protective circuit as that in the present embodiment or a protective circuit similar thereto can be applied to organic EL panels which have various pixel circuits, such as a voltage programming pixel circuit, a pixel circuit of a voltage comparison method, and a pixel circuit of a subframe method.

Moreover, in FIGS. 1 to 18, the organic EL device has been described, but the invention can be applied to light-emitting devices which use other self-emitting elements, such as an inorganic EL element, a field emission (FE) element, a surface-conduction emission (SE) element, a ballistic electron emission (BS) element, a light emitting diode (LED) element, and the like. Further, the light-emitting device in which the unit circuits are provided in the matrix shape has been described, but the invention can be applied to a light-emitting device in which the unit circuits are provided in one line. In addition, the invention is not limited to a display device. Like the embodiments, the invention can be applied to a light-emitting device, such as a writing head (line head) of an optical writing-type printer or electronic copy machine.

Electronic Apparatus

Next, various electronic apparatuses mounted with the above-described organic EL device will be described. Each electronic apparatus described below includes any one of the protective circuits of the electro-optical panels according to the first embodiment to the third embodiment.

<A: Mobile Computer>

Figure 9:
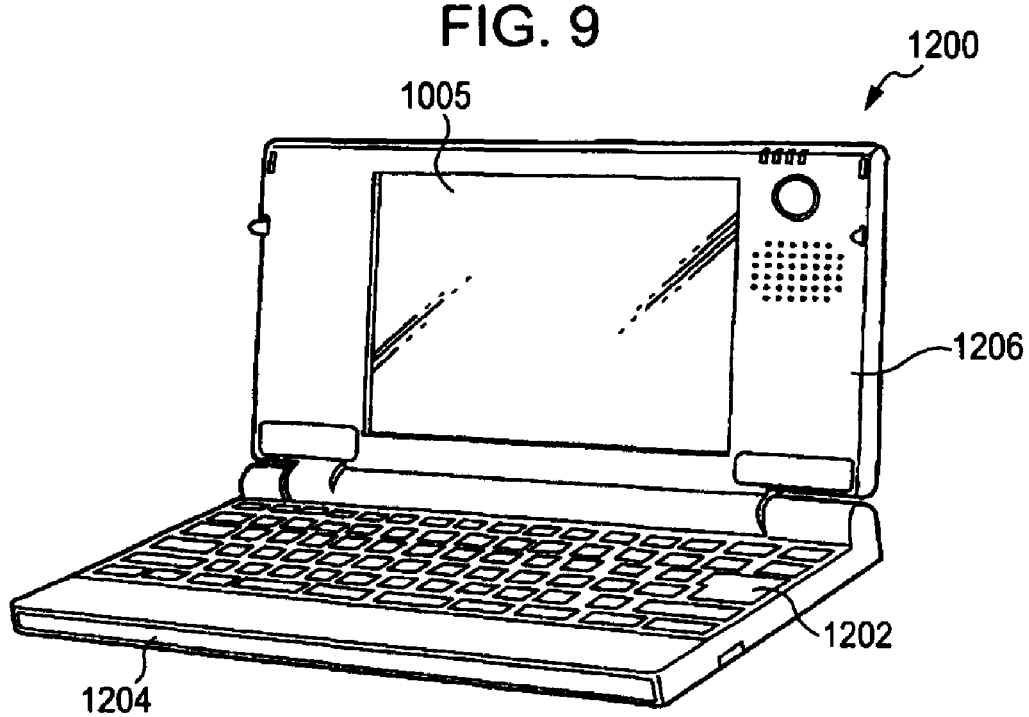
FIG. 9 is a perspective view showing an example of an electronic apparatus according to the invention.

An example in which the above-described organic EL device is applied to a mobile personal computer will be described with reference to FIG. 9. FIG. 9 is a perspective view showing a configuration of a computer 1200.

In FIG. 9, the computer 1200 includes a main body portion 1204 having a keyboard 1202 and a display unit 1206 having a display 1005 which is constituted by an organic EL device (not shown). In the display 1005, the electrostatic destruction of each element due to the electrostatic charge during the manufacturing process is reduced and thus the entire device has increased reliability. In addition, an image can be displayed with a high quality. Further, organic EL elements which emit three primary color light components of red, green, and blue, respectively, may be formed in a plurality of organic EL devices of the display 1005, such that the display 1005 can display an image with full color.

<B: Cellular Phone>

Figure 10:
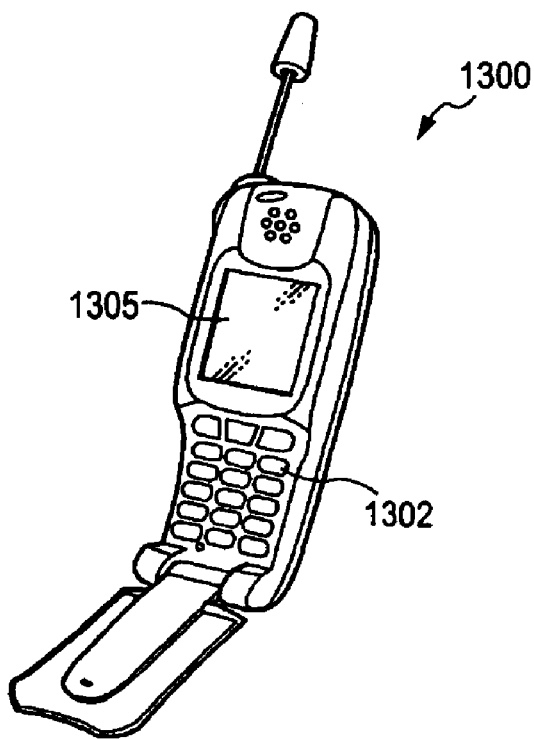
FIG. 10 is a perspective view showing another example of an electronic apparatus according to the invention.

Further, an example in which the above-described organic EL device is applied to a cellular phone will be described with reference to FIG. 10. FIG. 10 is a perspective view showing a configuration of a cellular phone 1300.

In FIG. 10, the cellular phone 1300 has a plurality of operating buttons 1302 and a display 1305 having the organic EL device which is an embodiment of the invention.

The display 1305 can display an image with a high quality, like the above-described display 1005, and has high reliability. The yield of the organic EL device of the display 1305 is enhanced, such that the entire cellular phone 1300 can be manufactured with increased durability at low cost. Further, a plurality of organic EL elements of the display 1305 may emit three primary color light components of red, green, and blue, such that the display 1305 can display an image with full color.

Moreover, the invention is not limited to the above-described embodiments, and various variations thereof can be made as appropriate within the scope without departing from the subject matter and spirit of the invention as read on the claims and the specification. A manufacturing method of an organic EL element, an organic EL element, and an electronic apparatus involving such variations also fall within the technical scope of the invention.

What is claimed is:

1. A light-emitting device comprising:
   an element formation region including a plurality of first unit circuits arranged in a light-emitting region and a plurality of second unit circuits arranged outside of the light-emitting region, each of the plurality of first unit circuits including (i) a light-emitting element having first and second electrodes and (ii) a first transistor that is electrically connected between a current supply line and the light-emitting element, and each of the plurality of second unit circuits including a second transistor that is electrically connected to the current supply line, the second unit circuits not having light-emitting elements; and
   a power source line arranged outside of the element formation region and connected to the current supply line that is arranged in the element formation region.

2. The light-emitting device as set forth in claim 1, each of the plurality of first unit circuits further including a third transistor that is connected to a data line; and
   each of the plurality of second unit circuits further including a fourth transistor that is connected to the data line.

3. The light-emitting device as set forth in claim 2,
   a same potential being supplied to the second and fourth transistors.

4. An electronic apparatus comprising the light-emitting device as set forth in claim 1.

* * * * *